United States Patent
Yamazaki

[11] Patent Number: 5,966,598
[45] Date of Patent: Oct. 12, 1999

[54] SEMICONDUCTOR DEVICE HAVING AN IMPROVED TRENCH ISOLATION AND METHOD FOR FORMING THE SAME

[75] Inventor: Toru Yamazaki, Tokyo, Japan

[73] Assignee: NEC Corporation, Tokyo, Japan

[21] Appl. No.: 08/912,066

[22] Filed: Aug. 15, 1997

Related U.S. Application Data

[62] Division of application No. 08/590,515, Jan. 24, 1996, Pat. No. 5,789,769.

[30] Foreign Application Priority Data

Jan. 24, 1995 [JP] Japan .......................................... 7-8959

[51] Int. Cl.$^6$ ..................................................... H01L 29/72
[52] U.S. Cl. ........................... 438/221; 438/225; 438/228; 438/296; 438/424; 438/631; 257/263; 257/304; 257/329; 257/511; 257/514; 257/517
[58] Field of Search ..................................... 438/221, 225, 438/228, 296, 424, 631

[56] References Cited

U.S. PATENT DOCUMENTS 3,818,289  6/1974  Mudge et al. ........................... 257/511

FOREIGN PATENT DOCUMENTS

| 0 041 776 | 12/1981 | European Pat. Off. . |
| 0 407 047 | 1/1991 | European Pat. Off. . |
| 0 482 591 | 4/1992 | European Pat. Off. . |
| 61-030046 | 2/1986 | Japan . |
| 3-276680 | 12/1991 | Japan . |
| 3-290961 | 12/1991 | Japan . |
| 4-326549 | 11/1992 | Japan . |
| 5-251551 | 9/1993 | Japan . |

Primary Examiner—Edward Wojciechowicz
Attorney, Agent, or Firm—Young & Thompson

[57] ABSTRACT

The invention provides a trench isolation structure comprising a semiconductor region, a first insulation film formed on a top surface of the semiconductor region, a trench groove extending vertically from the first insulation film into the semiconductor region so that a bottom of the trench groove lies below an interface between the first insulation film and the semiconductor region, and an inter-layer insulator being formed which resides not only on the first insulation film but also within the trench groove so that the inter-layer insulator fills up the trench groove.

The present invention still further provides a method for forming a trench isolation in a semiconductor region. The method comprises the following steps. A first insulation film is formed on a top surface of a semiconductor region. A trench groove is selectively formed which extends vertically from the first insulation film into the semiconductor region so that a bottom of the trench groove lies below an interface between the first insulation film and the semiconductor region. An inter-layer insulator is formed which resides not only on the first insulation film but also within the trench groove so that the inter-layer insulator fills up the trench groove. The trench groove is formed after the device is formed in the semiconductor region.

47 Claims, 21 Drawing Sheets

1 BPSG deposition

2 BPSG reflow

3 BPSG etchback

- Pad Oxidation
- Si$_3$N$_4$ Deposition
- LTO Deposition
- Trench Photo
- SiO$_2$/Si$_3$N$_4$/SiO$_2$ RIE

- Trench Si RIE
- Oxide Strip

- Trench Oxidation
- Poly-Si Refill
- Poly-Si Etchback

- Poly-Si Oxidation

- Device Island Photo
- $Si_3N_4$ RIE

- Field Oxidation
- $Si_3N_4$ Strip

SEMICONDUCTOR DEVICE HAVING AN IMPROVED TRENCH ISOLATION AND METHOD FOR FORMING THE SAME

This application is a divisional of application Ser. No. 08/590,515, filed Jan. 24, 1996 now U.S. Pat. No. 5,789,769 issued Aug. 4, 1998.

BACKGROUND OF THE INVENTION

The present invention relates to a semiconductor device having an improved trench isolation structure and a method for forming the same.

Trench isolation technique has been well known in the art as being effective to isolate two semiconductor devices formed on a common substrate. Typical one of the conventional trench isolation structures in the semiconductor devices will be described with reference to FIG. 1 which illustrates p-channel and n-channel MOS field effect transistors formed on a single semiconductor substrate 1. The single semiconductor substrate 1 is made of silicon doped with a p-type impurity. The p-channel and n-channel MOS field effect transistors are isolated by a trench isolation 11, wherein the p-channel MOS field effect transistor is provided at a left side of the trench isolation 11 whilst the n-channel MOS field effect transistor is provided at a right side of the trench isolation 11. The p-channel MOS field effect transistor is formed in an n-well region 31 formed over the semiconductor substrate 1 and at the left side of the trench isolation 11. The n-channel MOS field effect transistor is formed in a p-well region 30 formed over the semiconductor substrate 1 and at the right side of the trench isolation 11. The p-channel and n-channel MOS field effect transistors is provided to form a complementary MOS circuit. Field oxide films 5 are selectively formed to define active regions in the n-well and p-well regions 31 and 30. Gate oxide films 16 are formed on the active regions in the n-well and p-well regions 31 and 30. In the surface of the n-well region 31, p-type source/drain diffusion regions 34 are formed to define a channel region interposed between them. In the surface of the p-well region 30, n-type source/drain diffusion regions 33 are formed to define a channel region interposed between them. Gate electrodes 32 are provided on the gate oxide films 16 over the n-well and p-well regions 31 and 30 respectively.

The trench isolation 11 extends in a vertical direction from the field oxide film 5 to an upper region of the p-type semiconductor substrate 1 so as to completely isolate the n-well and p-well regions 31 and 30. The trench isolation region 11 comprises a trench groove, an insulation layer formed on inner walls of the trench groove and a polysilicon material 21 which is undoped. The polysilicon material 21 is formed on the insulation layer to fill up the trench groove. The top of the polysilicon material 21 is covered by an oxide film 22 which is formed by oxidation of the polysilicon material 21.

A first inter-layer insulator 12 is formed to cover an entire surface of the device. A second inter-layer insulator 13 is formed to cover an entire part of the first inter-layer insulator 12. The trench isolation 11 may be formed by etching from the field oxide film 5 to the upper portion of the semiconductor substrate 1.

A second typical conventional trench isolation is then described with reference to FIG. 2, wherein trench isolations 11 are provided to isolate a bipolar transistor from other regions. The bipolar transistor is formed over a p-type semiconductor substrate 1. An n-type buried layer 2 is formed on the p-type semiconductor substrate 1. An n-type epitaxial layer 3 is formed on the n-type buried layer 2. Field oxide films 5 are selectively formed in a surface of the n-type epitaxial layer 3 to define active regions interposed between them. Thin oxide films 16 are formed on the active regions the n-type epitaxial layer 3 serves as a collector region of the bipolar transistor. A collector plug region 6 is selectively formed in the n-type epitaxial region 3 on the other active region than the active region on which an emitter and a base are formed. A base region 7 comprising a p-type diffusion region is formed in an upper portion of the n-type epitaxial layer 3 under the thin oxide film on the active region. A base plug region 8 comprising a p-type diffusion region is formed in the upper portion of the n-type epitaxial layer 3, wherein the base plug region 8 is adjacent to and in contact with the base region 7. An emitter region 14 comprising an n-type diffusion region is formed in an upper portion of the p-type base region 7. The emitter region 14 is not covered by the thin oxide film 16, whilst the base region 7 and the base plug region 8 are covered by the thin oxide film 16. An emitter plug electrode 10 is formed on the emitter region 14.

The trench isolations 11 extend in a vertical direction from the field oxide film 5 through the n-type epitaxial layer 3 and the n-type buried layer 2 to an upper portion of the p-type semiconductor substrate 1. Each of the trench isolations 11 comprises a trench groove, an insulation film covering an inner wall of the trench groove and a polysilicon material 21 undoped. The polysilicon material 21 is provided to fill up the trench groove. The top of the polysilicon material 21 is covered by an oxide film which is formed by oxidation of the polysilicon material 21. At the bottom of each of the trench isolations 11, a channel stopper 4 comprising a p$^+$-region is formed. A first inter-layer insulator 9 is formed on an entire part of the device, except for an area on which the emitter plug electrode 10 resides. A second inter-layer insulator 12 is formed on an entire part of the device so that the second inter-layer insulator 12 covers the first inter-layer insulator 9 and the emitter plug electrode 10. A third inter-layer insulator 13 is formed on an entire surface of the second inter-layer insulator 12.

The trench isolations 11 isolate the collector region comprising a part of the epitaxial layer 3 from the other part of the epitaxial layer 3. This isolation of the collector region reduces a parasitic capacitance of the collector region with the buried layer 2. The reduction in the parasitic capacitance of the collector region with the buried layer 2 results in an improvement in high speed performance of the bipolar transistor such as increase in the switching speed thereof.

As a modification of the above conventional trench isolation, the trench groove may be filled with a boron phosphate silicate glass film (BPSG film) in place of the polysilicon material. The boron phosphate silicate glass film shows a fluidity when subjected to a heat treatment at a temperature in the range of 800–900° C.

A third typical conventional trench isolation will be disclosed in Japanese laid-open Patent Application No. 3-149849, wherein the trench isolation has a top which is planarized. Fabrication processes of the trench groove will be described with reference to FIGS. 3A through 3D.

As illustrated in FIG. 3A, a thin oxide film 16 is formed on a surface of a semiconductor substrate 1. A field oxide film 5 is selectively formed by a local oxidation of silicon method using a mask made of silicon nitride. The silicon nitride mask is then removed. A silicon nitride film 17 having a thickness of 100 nanometers is deposited by a chemical vapor deposition method on an entire surface of the device to cover the filed oxide film 5 and the thin silicon oxide film 16. A phosphate silicate glass film 23 having a thickness of approximately 400 nanometers is then formed on an entire surface of the silicon nitride film 17. A photo-resist film is formed on an entire surface of the phosphate silicate glass film 23 and then patterned by a photo-lithography to form a photo-resist pattern having an opening which is positioned over a part of the field oxide film 5. A reactive ion etching is carried out by using the photo-resist pattern as a mask and using florin gas to selectively etch the phosphate silicate glass film 23, the silicon nitride film 17, and the field oxide film 5. The photo-=resist pattern is then removed. A reactive ion etching is again carried out by using the phosphate silicate glass film 23 having an opening as a mask and using a chlorine gas to selectively etch the semiconductor substrate 1 so that a trench groove 11 is formed extending in a vertical direction from the phosphate silicate glass film 23 to the semiconductor substrate 1.

As illustrated in FIG. 3B, the phosphate silicate glass film 23 is removed by a wet etching. Subsequently, the silicon nitride film 17 is used as a mask to an inner surface of the trench groove 11 to oxidation thereby forming a silicon oxide film 25 on the inner wall of the trench groove 11. A polysilicon film is deposited on an entire surface of the device to deposit over the silicon nitride film 17 and within the trench groove 11. The deposited polysilicon film over the silicon nitride film 17 is removed by etch back or polishing so that the polysilicon film remains only within the trench groove 11.

As illustrated in FIG. 3C, a silicate glass material is applied by a spin coating method on an entire surface of the device so that the silicate glass material is made flat and has a thickness of 100 nanometers. Subsequently, the applied silicate glass material is cured at a temperature of 800° C. to form a silicate glass film 26 which covers an entire surface of the device. The substrate 1 is then placed in an oxygen atmosphere to cause oxygen to permeate through the silicate glass film 26 and reach the top of the polysilicon film 21 within the trench groove 11 so that an silicon oxide film 27 is formed at the top of the polysilicon film 21 within the trench groove 11. On the other hand, the silicon nitride film 17 prevents permeation of oxygen through itself. For this reason, the semiconductor substrate 1 which covered. by the silicon nitride film is not subjected to oxidation.

As illustrated in FIG. 3D, the silicate glass film 26 above the field oxide film 5 and the silicon nitride film 17 are removed by etching them to expose the field oxide film 5 and the thin film 16, provided that the silicate glass film 26 below the silicon nitride film 17 remains within the trench groove 11.

The above trench isolations have the following problems. First, a device is formed on a base layer which has a difference in level namely a step. With reference back to FIG. 3C, if etching of the silicate glass layer 26 is continued until the thin oxide film 16 is exposed, then the silicate glass layer 26 within the trench groove is also etched thereby resulting a recessed portion being formed within the trench groove. The recessed portion forms a step, namely has a difference in surface level. This cause is as follows. If the silicate glass is applied by a spin coating method, then the fluidity of the silicate glass causes that the silicate glass is deposited thickly on the thin oxide film 16 whilst the silicate glass is deposited thinly on the field oxide film 5. The thin oxide film 16 has the top which lies below the top of the field oxide film. For those reasons, if the silicate glass layer 26 is etched to expose the thin oxide film 16, then over etching of the silicate glass layer 26 on the field oxide film is caused. On the other hand, if the etching of the silicate glass layer 26 is stopped just when the top surface of the field oxide film 5 is exposed, then the silicate glass layer 26 remains only on the thin oxide film 16.

If the silicate glass 23 has the recessed portion namely the step at the top of the trench groove as described above and further a plurality of electrode patterns made of impurity-doped polysilicon is provided over the recessed portion or the step at the top of the trench groove, then the impurity-doped polysilicon would likely reside in the recessed portion in the dry etching process for patterning the electrodes. Such residual impurity-doped polysilicon in the recessed portion may likely cause any short circuit between the electrodes to be formed.

Further, if the width of the trench groove is reduced to obtain a scaling down of the device, then the following problems will be raised. With reference back to FIGS. 1 and 2, the oxide film 22 provided on the top of the trench isolation is formed by oxidation of the top of the polysilicon film 21. This oxidation is the thermal oxidation of silicon. The thermal oxidation causes thermal expansions of the top portion of the polysilicon film 21 and the oxide film. However, the thermal expansion coefficient of polysilicon differs from that of silicon oxide. This difference in thermal expansion coefficient between polysilicon and silicon oxide causes stresses at an interface between the field oxide film 5 and the epitaxial silicon layer underlying the field oxide film 5. Whereas such thermal stresses has both vertical and horizontal components, the horizontal component thereof is likely to be larger than the vertical component. Such stresses applied to the interface between the field oxide film 5 and the silicon layer may cause crystal defects at the interface between them. Particularly if the thickness of the oxide film 22 is large, for example, not less than 100 nanometers, then the crystal defects are likely caused. The crystal defects further cause crystal dislocations which extends along the interface between the field oxide film 5 and the silicon layer and may reach the diffusion regions acting as source/drain regions or the base regions. This results in remarkable deterioration in the device performances. This leads to a considerable reduction of the yield of the device manufacturing.

Whereas in the above descriptions, the trench groove is filled with the polysilicon material, a boron phosphate silicate glass film (BPSG film) and a phosphate silicate glass film (PSG film) are available to fill up the trench groove as disclosed in M. Sugiyama et al. 1989 Symp. VLSI, Dig. Paper, pp. 59–60. Fabrication processes are as illustrated in FIGS. 5A through 5C. The boron phosphate silicate glass film (BPSG film) and the phosphate silicate glass film (PSG film) generally show fluidity at a temperature of 900–950° C. In this case, the boron phosphate silicate glass film (BPSG film) or the phosphate silicate glass film (PSG film) is formed on a surface having a step namely a difference in level, then the fabrication processes are similar to those in case of the silicate glass film illustrated in FIGS. 3C and 3D. For this reason, there are substantially the same problems. In other words, if the etching of the boron phosphate silicate glass film (BPSG film) or the phosphate silicate glass film (PSG film) is continued until the thin oxide film on the active region is exposed, then the boron phosphate silicate glass film (BPSG film) or the phosphate silicate glass film (PSG film) is over-etched thereby forming a recessed portion or a step at the top of the trench groove. FIG. 4A illustrates this problem with the recessed portion being formed over the top of a phosphate silicate glass film (PSG film) 28. If, however, the etching of the boron phosphate silicate glass film (BPSG film) or the phosphate silicate glass film (PSG film) is stopped just when the top surface of the field oxide film is exposed, then the boron phosphate silicate glass film (BPSG film) or the phosphate silicate glass film (PSG film) resides on the thin oxide film in the active region.

If the trench isolation comprises the trench groove filled with the boron phosphate silicate glass film (BPSG film) or the phosphate silicate glass film (PSG film), then the following problem is raised. Any heat treatment is normally carried out to form diffusion regions such as source/drain regions or base and emitter regions after the trench isolation is completely formed. Such heat treatment causes diffusions of boron and phosphorus atoms externally from the boron phosphate silicate glass film (BPSG film) or the phosphate silicate glass film (PSG film) within the trench groove. The diffused boron and phosphorus atoms act as impurities thereby causing variation in threshold voltage of the MOS transistor.

If the trench isolation comprises the trench groove filled with the boron phosphate silicate glass film (BPSG film) deposited by the chemical vapor deposition or filled with undoped polysilicon, then the following problem is raised. After filling the trench groove with those materials, a chemical treatment may often be carried out using a fluorine acid. The boron phosphate silicate glass film (BPSG film) and the undoped polysilicon film are etched by the fluorine acid base chemical. The etching rates thereof are larger than that of the thermal oxide film. For this reason, those materials within the trench groove may be removed partially or entirely.

In order to avoid the above problem, it is effective to form, as illustrated in FIG. 4B, a cap 24 made of etching-resistive material such as silicon nitride so that the cap 24 covers the top of the boron phosphate silicate glass film (BPSG film) and the undoped polysilicon film 28 within the trench groove 11. The cap 24 is formed by patterning process using photo-lithography. This increases the number of the fabrication processes.

The above trench isolation is available to isolate analog circuits from digital circuits, wherein the analog and digital circuits are formed on a single substrate, in order to prevent that digital noises generated by the digital circuits are propagated to the analog circuits as disclosed in Japanese laid-open Patent Application No. 3-178161. This trench isolation has substantially the same structure as described above. For this reason, such trench isolation may cause the same problem as described above.

Whereas in the above described prior art the trench isolation is formed after the field oxide film is formed, there is a different fabrication process, wherein the trench isolation is formed before the field oxide film is formed, as disclosed in 1990 J. Electrochem. Soc. Vol. 137, No. 6 pp. 1942–1950 "Planarized Deep-Trench Process fro Self-Aligned Double Polysilicon Bipolar Device Isolation". Fabrication processes are illustrated in FIGS. 6A through 6F which illustrate clearly that the trench isolation is formed before the field oxide film is formed over the top of the trench isolation. This isolation structure provides a flat surface of the field oxide film. There is no recessed portion nor step at the field oxide film over the trench isolation. Such isolation structure still has the following problems.

If the trench groove is filled with the insulating material containing any impurity, then the impurity diffusion externally from the trench isolation is caused by a heat treatment carried out for a device formation after the trench isolation and the field oxide film have been formed. As described above, the impurity diffusion externally from the trench isolation causes a variation in threshold voltage of the MOS transistor. Further in the LOCOS process for thermally growing the field oxide film, the field oxide film shows a different thermal expansion from that of the silicon epitaxial layer. This difference in thermal expansion between the silicon oxide film and the silicon epitaxial layer causes a stress at an interface between the silicon oxide film and the silicon epitaxial layer. The stress concentrates the field oxide film and the trench isolation. Whereas this thermal stress has horizontal and vertical components, the horizontal component is relatively larger than the vertical component. The thermal stress causes crystal defects at the interface between the field oxide film and the silicon epitaxial layer. This crystal defects cause a crystal dislocation which extends along the interface between the field oxide film and the silicon epitaxial layer and reaches the diffusion regions acting as source/drain regions. This causes a leakage current thereby resulting in a deterioration in device performance. The development of the novel trench isolation structure free from any of the above problems had been required.

SUMMARY OF THE INVENTION

Accordingly, it is an object of the present invention to provide a novel trench isolation structure free from any of the above-described problems.

It is an additional object of the present invention to provide a novel method for forming a trench isolation structure free from any of the above-described problems.

The above and other objects, features and advantages of the present invention will be apparent from the following descriptions.

The invention provides a trench isolation structure comprising a semiconductor region, a first insulation film formed on a stop surface of the semiconductor region, a trench groove extending vertically from the first insulation film into the semiconductor region so that a bottom of the trench groove lies below an interface between the first insulation film and the semiconductor region, and an inter-layer insulator being formed to reside not only on the first insulation film but also within the trench groove so that the inter-layer insulator fills up the trench groove.

According to the above descriptions, if the trench isolation filled with the inter-layer insulator were subject to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

The present invention also provides another trench isolation structure comprising a silicon region, a first insulation film formed on a top surface of the silicon region, a trench groove extending vertically from the first insulation film to the silicon region so that a bottom of the trench groove lies below an interface between the first insulation film and the silicon region, a second insulation film formed to extend at least on vertical side walls and a bottom wall of the trench groove, and an inter-layer insulator being formed to reside not only on the first insulation film but also on at least an upper portion of the second insulation film on the vertical side walls so that the inter-layer insulator fills up at least an upper region of the trench groove and the remaining part of the trench groove is filled with a polysilicon film.

According to the above descriptions, if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

The present invention still further provides a method for forming a trench isolation in a semiconductor region. The method comprises the following steps. A first insulation film is formed on a top surface of a semiconductor region. A trench groove is selectively formed to extend vertically from the first insulation film into the semiconductor region so that a bottom of the trench groove lies below an interface between the first insulation film and the semiconductor region. An inter-layer insulator is formed to reside not only on the first insulation film but also within the trench groove so that the inter-layer insulator fills up the trench groove. The trench groove is formed after the device is formed in the semiconductor region.

According to the above descriptions, the device is formed, before the trench groove is formed and then the trench groove is filled up with the inter-layer insulator. This means that the inter-layer insulator, which fills up the trench groove, is not subjected to the heat treatments for forming the device. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region of the device. No crystal dislocation causes no current leakage nor other deterioration of the device performance.

Even if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the device. This ensures that the trench isolation is free from any impurity diffusions externally from the trench groove into the epitaxial layer. Thus, the device is free of any variation in impurity concentration.

Further as described above, filling up the trench isolation and the formation of the inter-layer insulator are simultaneously made. This results in a considerable reduction, for example, about 70% reduction, in the number of fabrication steps actually carried out for forming the trench isolation.

The present invention also provides another method for forming a trench isolation structure in a silicon region, comprising the following steps. A first insulation film is formed on a top surface of a silicon region. A trench groove is selectively formed which extends vertically from the first insulation film to the silicon region so that a bottom of the trench groove lies below an interface between the first insulation film and the silicon region. A second insulation film is formed which extends at least on vertical side walls and a bottom wall of the trench groove. A polysilicon film is selectively formed on the second insulation film except on its upper portion so that the polysilicon film fills with the trench groove expect for its upper region. An inter-layer insulator is formed which resides not only on the first insulation film but also on the polysilicon film so that the inter-layer insulator fills up the upper region of the trench groove. The trench groove is formed after the device is formed in the semiconductor region.

According to the above descriptions, the device is formed, before the trench groove is formed and then the trench groove is filled up with the inter-layer insulator. This means that the inter-layer insulator, which fills up the trench groove, is not subjected to the heat treatments for forming the device. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region of the device. No crystal dislocation causes no current leakage nor other deterioration of the device performance.

Even if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the device. This ensures that the trench isolation is free from any impurity diffusions externally from the trench groove into the epitaxial layer. Thus, the device is free of any variation in impurity concentration.

Further as described above, filling up the trench isolation and the formation of the inter-layer insulator are simultaneously made. This results in a considerable reduction, for example, about 70% reduction, in the number of fabrication steps actually carried out for forming the trench isolation.

BRIEF DESCRIPTION OF THE DRAWINGS

Preferred embodiments of the present invention will be described in detail with reference to the accompanying drawings.

DISCLOSURE OF THE INVENTION

Figure 1:
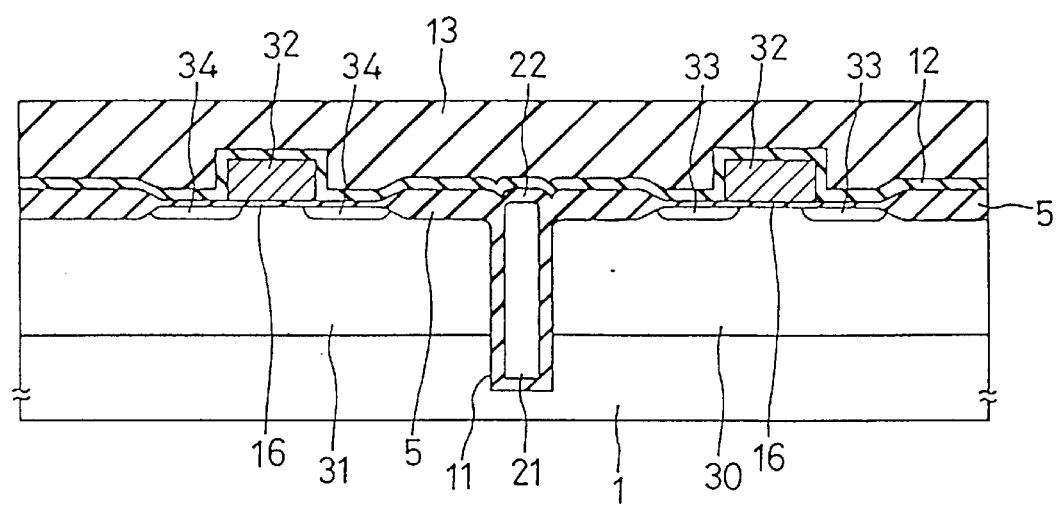
FIG. 1 is a fragmentary cross sectional elevation view illustrative of the conventional trench isolation which isolates n-channel and p-channel MOS transistors formed on a single semiconductor substrate.
Figure 2:
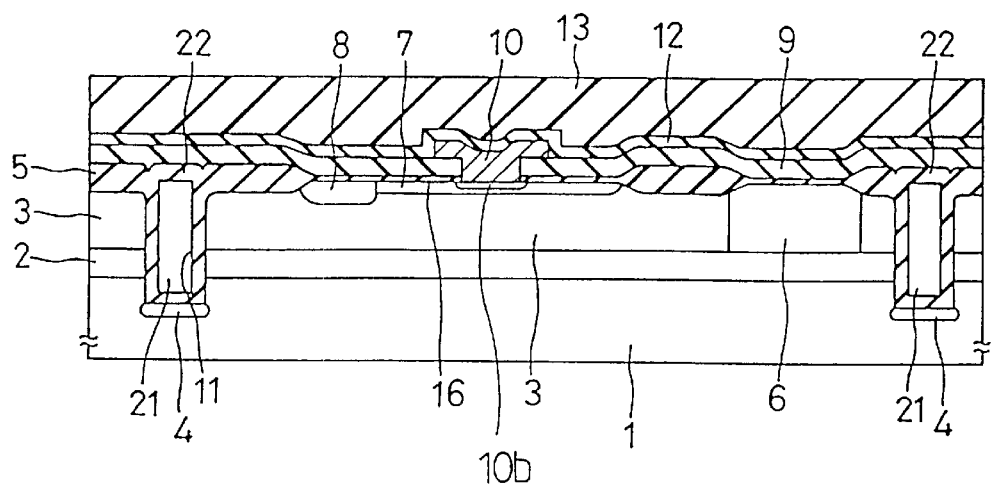
FIG. 2 is a fragmentary cross sectional elevation view illustrative of the conventional trench isolations which isolate a bipolar transistor formed on a single semiconductor substrate.
Figure 3A:
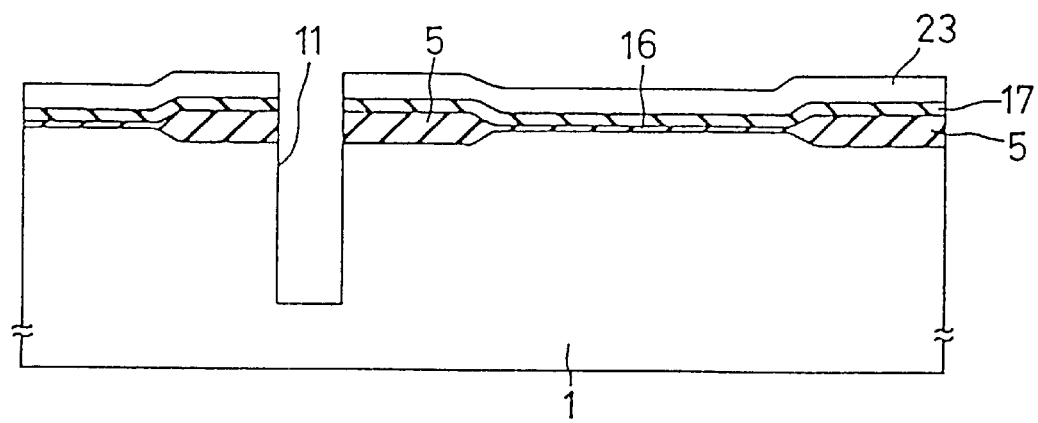
FIGS. 3A through 3D are fragmentary cross sectional elevation views illustrative of the conventional trench isolation in sequential fabrication steps involved in the conventional fabrication method.
Figure 3B:
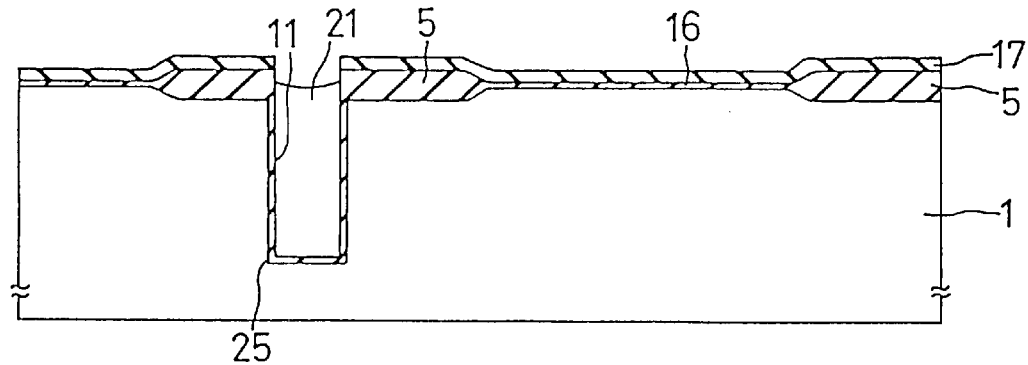
Figure 3C:
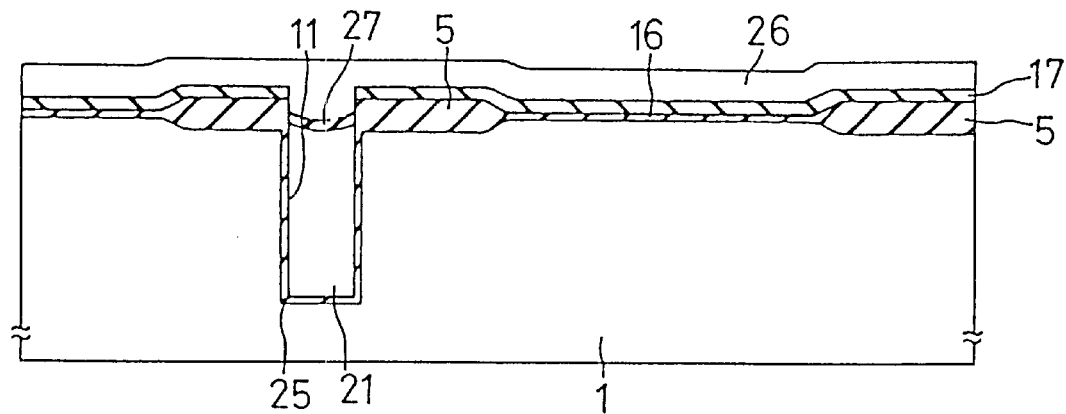
Figure 3D:
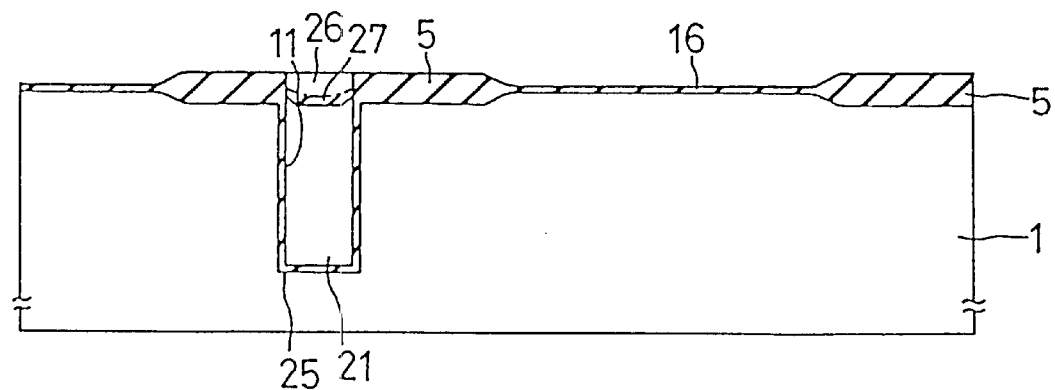
Figure 4A:
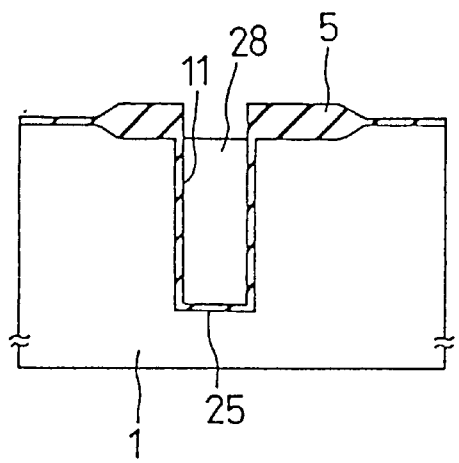
FIG. 4A is a fragmentary cross sectional elevation view illustrative of the other conventional trench isolation formed on a single semiconductor substrate.
Figure 4B:
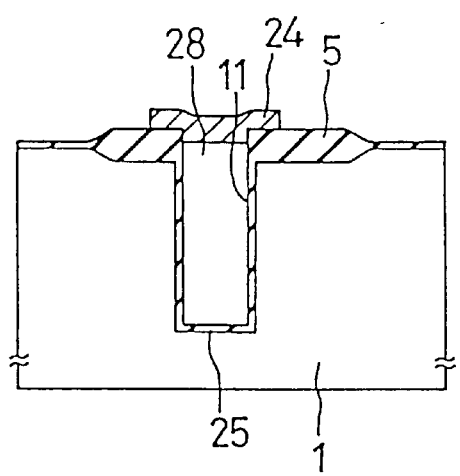
FIG. 4B is a fragmentary cross sectional elevation view illustrative of the other conventional trench isolation formed on a single semiconductor substrate.
Figure 5A:
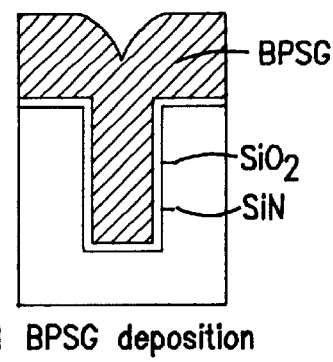
FIGS. 5A through 5C are fragmentary cross sectional elevation views illustrative of the other conventional trench isolation in sequential fabrication steps involved in the other conventional fabrication method.
Figure 5B:
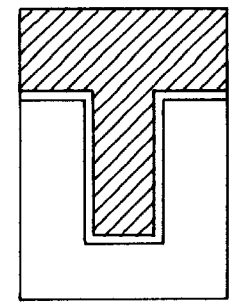
Figure 5C:
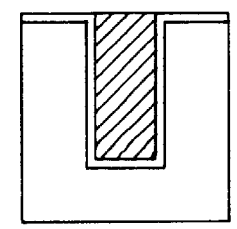
Figure 6A:
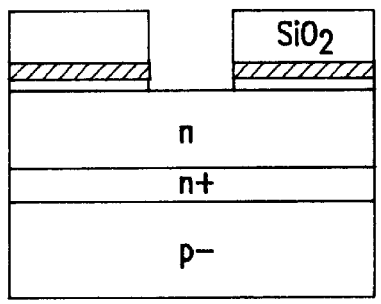
FIGS. 6A through 6F are fragmentary cross sectional elevation views illustrative of the other conventional trench isolation in sequential fabrication steps involved in the other conventional fabrication method.
Figure 6B:
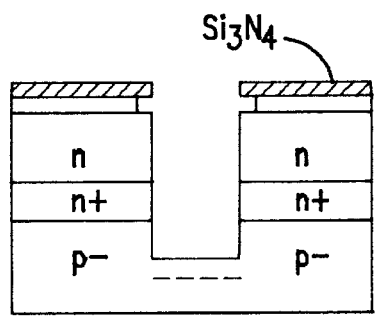
Figure 6C:
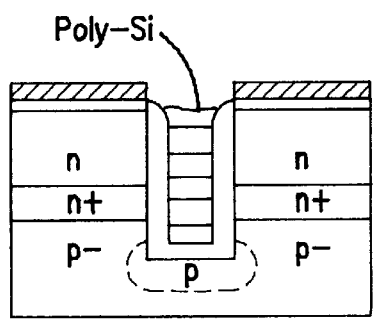
Figure 6D:
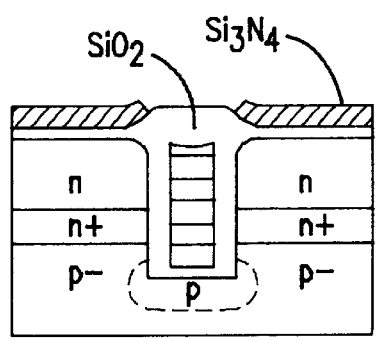
Figure 6E:
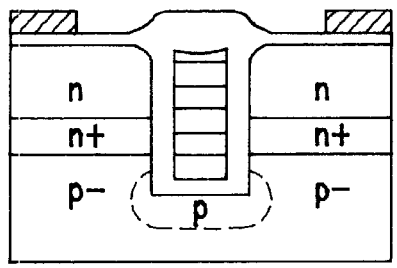
Figure 6F:
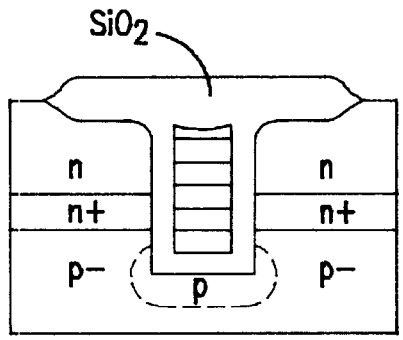

The invention provides a trench isolation structure comprising a semiconductor region, a first insulation film formed on a top surface of the semiconductor region, a trench groove extending vertically from the first insulation film into the semiconductor region so that a bottom of the trench groove lies below an interface between the first insulation film and the semiconductor region, and an inter-layer insulator being formed to reside not only on the first insulation film but also within the trench groove so that the inter-layer insulator fills up the trench groove.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

It is optionally available to further provide a second insulation film formed to extend between the first insulation film and the inter-layer formed to extend between the first insulation film and the inter-layer insulator, wherein the second insulation film also extends on vertical side walls and a bottom wall of the trench groove so that the second isolation film isolates the inter-layer insulator from the vertical side walls and the bottom wall.

It is optionally available that the first insulation film comprises a thin silicon oxide film provided that the semiconductor region is made of silicon.

It is optionally available that the first insulation film comprises a thin silicon oxide film portion and thick field oxide film portions sandwiching the thin silicon oxide film portion provided that the semiconductor region is made of silicon. It is further available that the trench groove extends vertically from the thin silicon oxide film portion into the semiconductor region so that an opening portion of the trench groove is positioned below top portions of the field oxide film portions, and an interface between the inter-layer insulator and the first insulation film is sloped down toward the opening portion.

It is optionally available that the first insulation film comprises a thick field oxide film portion and thin silicon oxide film portions sandwiching the thick field oxide film portion provided that the semiconductor region is made of silicon. It is further available that the trench groove extends vertically from the thick field oxide film portion into the semiconductor region.

It is optionally available to further provide spacer layers which extend both on the thin silicon oxide film portions and on a part of the thick field oxide film portion so that the inter-layer insulator extends both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the second isolation film comprises a silicon oxide film, provided that the semiconductor region is made of silicon.

It is optionally available that the second isolation film comprises laminations of a silicon oxide film and a silicon nitride film, provided that the semiconductor region is made of silicon.

It is optionally available that the semiconductor region comprises a silicon substrate, and an impurity-doped well region formed on the silicon substrate, and that the trench groove extends into the silicon substrate.

It is optionally available that the semiconductor region comprises a silicon substrate, a buried layer formed on the silicon substrate, and an epitaxial layer formed on the buried layer, and that the trench groove extends into the silicon substrate.

The present invention also provides another trench isolation structure comprising a silicon region, a first insulation film formed on a top surface of the silicon region, a trench groove extending vertically from the first insulation film to the silicon region so that a bottom of the trench groove lies below an interface between the first insulation film and the silicon region, a second insulation film formed to extend at least on vertical side walls and a bottom wall of the trench groove, and an inter-layer insulator being formed to reside not only on the first insulation film but also on at least an upper portion of the second insulation film on the vertical side walls so that the inter-layer insulator fills up at least an upper region of the trench groove and the remaining part of the trench groove is filled with a polysilicon film.

According to the above descriptions, if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

It is optionally available that an entire part of the trench groove is filled up with the inter-layer insulator.

It is optionally available that the first insulation film comprises a thin silicon oxide film.

It is optionally available that the first insulation film comprises a thin silicon oxide film portion and thick field oxide film portions sandwiching the thin silicon oxide film portion, and also available that the trench groove extends vertically from the thin silicon oxide film portion into the silicon region so that an opening portion of the trench groove is positioned below top portions of the field oxide film portions, and so that an interface between the inter-layer insulator and the first insulation film is sloped down toward the opening portion.

It is optionally available that the first insulation film comprises a thick field oxide film portion and thin silicon oxide film portions sandwiching the thick field oxide film portion, and that the trench groove extends vertically from the thick field oxide film portion into the silicon region.

It is optionally available to further provide spacer layers which extend both on the thin silicon oxide films and on a part of the thick field oxide film so that the inter-layer insulator extends both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the second isolation film comprises a silicon oxide film.

It is optionally available that the second isolation film comprises laminations of a silicon oxide film and a silicon nitride film.

It is optionally available that the silicon region comprises a silicon substrate, and an impurity-doped well region formed on the silicon substrate, and that the trench groove extends into the silicon substrate.

It is optionally available that the silicon region comprises a silicon substrate, a buried layer formed on the silicon substrate, and an epitaxial layer formed on the buried layer, and that the trench groove extends into the silicon substrate.

The present invention further provides a bipolar transistor with trench isolations. The bipolar transistor is formed on a silicon substrate and has the following structure. A buried layer is formed on the silicon substrate. An epitaxial layer is formed on the buried layer. A first insulation film is formed on a top surface of the epitaxial layer, wherein the first insulation film comprises at least one thin oxide film portion and at least two thick field oxide film portions sandwiching the above at least one thin oxide film portion. A base region is selectively formed in an upper region of the epitaxial layer and under the above at least one thin oxide film portion. An emitter region is selectively formed in an upper region of the base region. An emitter plug electrode is formed on the emitter region. At least one trench groove is formed which extends vertically from the first insulation film through the epitaxial layer and the buried layer into the silicon substrate. An inter-layer insulator is formed to extend over the first insulation film and above the emitter plug electrode. The inter-layer insulator further resides within the trench groove so that the inter-layer insulator fills up the trench groove.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

It is optionally available to further provide a second insulation film formed to extend between the first insulation film and the inter-layer insulator, wherein the second insulation film also extends on vertical side walls and a bottom wall of the trench groove so that the second isolation film isolates the inter-layer insulator from the vertical side walls and the bottom wall.

It is optionally available that the trench groove extends vertically from the thick field oxide film portion into the silicon substrate.

It is optionally available to further provide spacer layers which extend both on a part of the thin silicon oxide film portion and on a part of the thick field oxide film portion so that the inter-layer insulator extends both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the first insulation film further has additional thin oxide film portions outside the above at least two field oxide film portions and available that the trench groove extends from the additional thin film through the epitaxial layer and the buried layer into the silicon substrate so that an opening portion of the trench groove is positioned below top portions of the field oxide film portions, and so that an interface between the inter-layer insulator and the first insulation film is sloped down toward the opening portion.

The present invention also provides another bipolar transistor with trench isolations. The bipolar transistor is formed on a silicon substrate and has the following structure. A buried layer is formed on the silicon substrate. An epitaxial layer is formed on the buried layer. A first insulation film is formed on a top surface of the epitaxial layer, wherein the first insulation film comprises at least one thin oxide film portion and at least two thick field oxide film portions sandwiching the above at least one thin oxide film. A base region is selectively formed in an upper region of the epitaxial layer and under the above at least one thin oxide film. An emitter region is selectively formed in an upper region of the base region. An emitter plug electrode is formed on the emitter region. At least one trench groove is formed which extends vertically from the first insulation film through the epitaxial layer and the buried layer into the silicon substrate. A second insulation film is formed to extend at least on vertical side walls and a bottom wall of the trench groove. An inter-layer insulator is formed which resides on the first insulation film and above the emitter plug electrode. The inter-layer insulator further extends on at least an upper portion of the second insulation film on the vertical side walls so that the inter-layer insulator fills up at least an upper region of the trench groove and the remaining part of the trench groove is filled with a polysilicon film.

According to the above descriptions, if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

It is optionally available that an entire part of the trench groove is filled up with the inter-layer insulator.

It is optionally available that the trench groove extends vertically from the thick field oxide film portion into the silicon substrate.

It is optionally available to further provide spacer layers which extend both on a part of the thin silicon oxide film portion and on a part of the thick field oxide film portion so that the inter-layer insulator extends both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the first insulation film further has additional thin oxide film portions outside the above at least two field oxide film portions and available that the trench groove extends form the additional thin film through the epitaxial layer and the buried layer into the silicon substrate so that an opening portion of the trench groove is positioned below top portions of the field oxide film portions, and so that an interface between the inter-layer insulator and the first insulation film is sloped down toward the opening portion.

The present invention further provides a MOS field effect transistor with a trench isolation. The MOS field effect transistor is formed on a silicon substrate and has the following structure. An impurity doped well region is formed on the silicon substrate. A first insulation film is formed on a top surface of the impurity doped well region, wherein the first insulation film comprises at least one thick field oxide film portion and at least two thin oxide film portions sandwiching the above at least one thick field oxide film portion. Source/drain diffusion regions are selectively formed in an upper region of the impurity doped well region and under each of the thin oxide film portions, wherein the source/drain diffusion regions define a channel region under each of the thin oxide film portions. At least two gate electrodes are formed on the above at least two thin film portions over the channel regions. A trench groove is formed which extends vertically from the thick field oxide film portion through the impurity doped well region into the silicon substrate. An inter-layer insulator is formed which extends over the first insulation film and above the gate electrode, wherein the inter-layer insulator further resides within the trench groove so that the inter-layer insulator fills up the trench groove.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

It is optionally available to further provide a second insulation film which extends between the first insulation film and the inter-layer insulator, wherein the second insulation film also extends on vertical side walls and a bottom wall of the trench groove so that the second isolation film isolates the inter-layer insulator from the vertical side walls and the bottom wall.

It is optionally available that the above at least two gate electrodes respectively extend both on the thin silicon oxide film portions and on parts of the thick field oxide film portions so that the inter-layer insulator extends both on the gate electrodes and on the remaining part, which is not covered by the gate electrodes, of the field oxide film portion, and so that a bottom face of the inter-layer insulator positioned above the trench groove has steps which are down toward an opening of the trench groove.

The present invention provides another MOS field effect transistor with a trench isolation. The MOS field effect transistor is formed on a silicon substrate and has the following structure. An impurity doped well region is formed on the silicon substrate. A first insulation film is formed on a top surface of the impurity doped well region, wherein the first insulation film comprises at least one thick field oxide film portion and at least two thin oxide film portions sandwiching the above at least one thick field oxide film portion. Source/drain diffusion regions are selectively formed in an upper region of the impurity doped well region and under each of the thin oxide film portions, wherein the source/drain diffusion regions define a channel region under each of the thin oxide film portions. At least two gate electrodes are formed on the above at least two thin film portions over the channel regions. A trench groove is formed which extends vertically from the thick field oxide film portion through the impurity doped well region into the silicon substrate. A second insulation film is formed which extends at least on vertical side walls and a bottom wall of the trench groove. An inter-layer insulator is formed which resides on the first insulation film and above the gate electrode, wherein the inter-layer insulator further extends on at least an upper portion of the second insulation film on the vertical side walls so that and the remaining part of the trench groove is filled with a polysilicon film.

According to the above descriptions, if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

It is optionally available that an entire part of the trench groove is filled up with the inter-layer insulator.

It is optionally available that the above at least two gate electrodes respectively extend both on the thin silicon oxide film portions and on parts of the thick field oxide film portions so that the inter-layer insulator extends both on the gate electrodes and on the remaining part, which is not covered by the gate electrodes, of the field oxide film portion, and so that a bottom face of the inter-layer insulator positioned above the trench groove has steps which are down toward an opening of the trench groove.

The present invention still further provides a method for forming a trench isolation in a semiconductor region. The method comprises the following steps. A first insulation film is formed on a top surface of a semiconductor region. A trench groove is selectively formed to extend vertically from the first insulation film into the semiconductor region so that a bottom of the trench groove lies below an interface between the first insulation film and the semiconductor region. An inter-layer insulator is formed to reside not only on the first insulation film but also within the trench groove so that the inter-layer insulator fills up the trench groove.

According to the above descriptions, the device is formed, before the trench groove is formed and then the trench groove is filled up with the inter-layer insulator. This means that the inter-layer insulator, which fills up the trench groove, is not subjected to the heat treatments for forming the device. This means that the trench isolation is free from any thermal device. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region of the device. No crystal dislocation causes no current leakage nor other deterioration of the device performance.

Even if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the device. This ensures that the trench isolation is free from any impurity diffusions externally from the trench groove into the epitaxial layer. Thus, the device is free of any variation in impurity concentration.

Further as described above, filling up the trench isolation and the formation of the inter-layer insulator are simultaneously made. This results in a considerable reduction, for example, about 70% reduction, in the number of fabrication steps actually carried out for forming the trench isolation.

It is optionally available to further form, after the above third step, a second insulation film which extends both on the first insulation film and on vertical side walls and a bottom wall of the trench groove.

It is optionally available that the first oxide film is formed by the steps of forming a thin oxide film on an entire surface of the semiconductor region, and then selectively forming thick field oxide films so that the first insulation film comprises a thin silicon oxide film portion and thick field oxide film portions sandwiching the thin silicon oxide film portion. It is also available that the trench groove is formed to extend vertically from the thin silicon oxide film portion into the semiconductor region so that an opening portion of the trench groove is positioned below top portions of the field oxide film portions, and so that an interface between the inter-layer insulator and the first insulation film is sloped down toward the opening portion.

It is optionally available that the first oxide film is formed by the steps of forming a thin oxide film on an entire surface of the semiconductor region, and then selectively forming thick field oxide films so that the first insulation film comprises a thick field oxide film portion and thin silicon oxide film portions sandwiching the thick field oxide film portion. It is also available that the trench groove is formed to extend vertically from the thick field oxide film portion into the semiconductor region.

It is optionally available to further includes the step of forming spacer layers which extend both on the thin silicon oxide film portions and on a part of the thick field oxide film portion so that the inter-layer insulator is formed to extend both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the second isolation film is formed by the step of forming a silicon oxide film both on the first insulation film and on the vertical side walls and the bottom wall of the trench groove.

It is optionally available that the second isolation film is formed by the steps of forming a silicon oxide film both on the first insulation film and on the vertical side walls and the bottom wall of the trench groove, and then forming a silicon nitride film on the silicon oxide film.

It is optionally available that the inter-layer insulator is formed by chemical vapor deposition of an insulation material which shows a fluidity at a high temperature.

It is optionally available that the inter-layer insulator is formed by chemical vapor deposition of boron phosphate silicate glass and subsequent heat treatment at a temperature of approximately 900° C. for about twenty minutes.

It is optionally available that the trench groove is formed after at least one device is formed in the semiconductor region.

The present invention also provides another method for forming a trench isolation structure in a silicon region, comprising the following steps. A first insulation film is formed on a top surface of a silicon region. A trench groove is selectively formed which extends vertically from the first insulation film to the silicon region so that a bottom of the trench groove lies below an interface between the first insulation film and the silicon region. A second insulation film is formed which extends at least on vertical side walls and a bottom wall of the trench groove. A polysilicon film is selectively formed on the second insulation film except on its upper portion so that the polysilicon film fills with the trench groove expect for its upper region. An inter-layer insulator is formed which resides not only on the first insulation film but also on the polysilicon film so that the inter-layer insulator fills up the upper region of the trench groove.

According to the above descriptions, the device is formed, before the trench groove is formed and then the trench groove is filled up with the inter-layer insulator. This means that the inter-layer insulator, which fills up the trench groove, is not subjected to the heat treatments for forming the device. The means that the trench isolation is free from any thermal expansion due to the above heat treatment. This ensures that no thermal stress is caused at any positions around the trench isolation. Thus no thermal stress causes no crystal defect at any positions around the trench isolation. No crystal defect causes no crystal dislocation which extends along an interface between the silicon layer and the silicon oxide film and reaches an active region of the device. No crystal dislocation causes no current leakage nor other deterioration of the device performance.

Even if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the device. This ensures that the trench isolation is free from any impurity diffusions externally from the trench groove into the epitaxial layer. Thus, the device is free of any variation in impurity concentration.

Further as described above, filling up the trench isolation and the formation of the inter-layer insulator are simultaneously made. This results in a considerable reduction, for example, about 70% reduction, in the number of fabrication steps actually carried out for forming the trench isolation.

Furthermore, the above isolation structure is suitable for a trench groove which has a high aspect ratio since it is sufficient to fill up at least the upper portion of the trench groove with the inter-layer insulator. As can be seen, it is generally difficult to fill up the entire part of the trench groove having the large aspect ratio with the inter-layer insulator, even the inter-layer insulator is made of a material which shows a fluidity. Actually, however, when a high density integration of the device is required, then it is also required to reduce the width of the trench groove. The reduction in the width of the trench groove results in a large aspect ratio of the trench groove. The above trench isolation structure is applicable when the trench groove has an extremely large aspect ratio, or an extremely small width.

It is optionally available that the first oxide film is formed by the steps of forming a thin oxide film on an entire surface of the semiconductor region, and then selectively forming thick field oxide films so that the first insulation film comprises a thin silicon oxide film portion and thick field oxide film portions sandwiching the thin silicon oxide film portion. It is also available that the trench groove is formed to extend vertically from the thin silicon oxide film portion into the semiconductor region so that an opening portion of the trench groove is positioned below top portions of the field oxide film portions, and so that an interface between the inter-layer insulator and the first insulation film is sloped down toward the opening portion.

It is optionally available that the first oxide film is formed by the steps of forming a thin oxide film on an entire surface of the semiconductor region, and then selectively forming thick field oxide films so that the first insulation film comprises a thick field oxide film portion and thin silicon oxide film portions sandwiching the thick field oxide film portion. It is also available that the trench groove is formed to extend vertically from the thick field oxide film portion into the semiconductor region.

It is optionally available to further include the step of forming spacer layers which extend both on the thin silicon oxide film portions and on a part of the thick field oxide film portion so that the inter-layer insulator is formed to extend both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the second isolation film is formed by the step of forming a silicon oxide film both on the first insulation film and on the vertical side walls and the bottom wall of the trench groove.

It is optionally available that the second isolation film is formed by the steps of forming a silicon oxide film both on the first insulation film and on the vertical side walls and the bottom wall of the trench groove, and then forming a silicon nitride film on the silicon oxide film.

It is optionally available that the polysilicon film is formed by chemical vapor deposition of polysilicon and subsequent selective etching the deposited polysilicon.

It is optionally available that the inter-layer insulator is formed by chemical vapor deposition of an insulation material which shows a fluidity at a high temperature.

It is optionally available that the inter-layer insulator is formed by chemical vapor deposition of boron phosphate silicate glass and subsequent heat treatment at a temperature of approximately 900° C. for about twenty minutes.

It is optionally available that the trench groove is formed after at least one device is formed in the semiconductor region.

The present invention further more provides a method for forming a bipolar transistor with trench isolations comprising the following steps. A buried layer is formed on a silicon substrate. An epitaxial layer is formed on the buried layer. A first insulation film is formed on a top surface of the epitaxial layer, wherein the first insulation film comprises at least one thin film portion and at least two thick field oxide film portions sandwiching the above at least one thin oxide film portion. A base region is selectively formed in an upper region of the epitaxial layer and under the thin oxide film portion. An emitter region is selectively formed in an upper region of the base region after an emitter plug electrode is formed on a part of the base region. At least one trench groove is selectively formed which extends vertically from the first insulation film through the epitaxial layer and the buried layer into the silicon substrate. An inter-layer insulator is formed both over the first insulation film and above the emitter plug electrode and within the trench groove so that the inter-layer insulator fills up the trench groove.

According to the above descriptions, the base, emitter and collector regions of the bipolar transistor are formed, before the trench grooves are formed and then the trench grooves are filled up with the inter-layer insulators. This means that the inter-layer insulator, which fills up the trench groove, is not subjected to the heat treatments for forming the collector, base and emitter regions. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region. No crystal dislocation causes no current leakage nor other deterioration of the device performance.

Even if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any position around the trench isolation. No stress concentration prevents formation of crystal defects at any positions around the trench isolation. No crystal defect causes no crystal dislocation which extends along an interface between the silicon layer and reaches an active region.

No crystal dislocation causes no current leakage nor other deterioration of the device performance.

As described above, the formation of the trench isolation is made after the formation of the bipolar transistor. This ensures that the trench isolation is free from any impurity diffusions of boron or phosphorus externally from the trench groove into the epitaxial layer. Thus, the bipolar transistor is free of any variation in impurity concentration of the epitaxial layer acting as a collector region.

Further as described above, filling up the trench isolation and the formation of the inter-layer insulator are simultaneously made. This results in a considerable reduction, for example, about 70% reduction, in the number of fabrication steps actually carried out for forming the trench isolation.

The above novel trench isolation provides the same collector-substrate parasitic capacitance as the conventional one.

It is optionally available to further include the step of forming, after the above seventh step, a second insulation film which extends both on the first insulation film and on vertical side walls and a bottom wall of the trench groove.

It is optionally available that the first oxide film is formed by the steps of forming a thin oxide film on an entire surface of the epitaxial layer, and then selectively forming thick field oxide films so that the first insulation film comprises a thin silicon oxide film portion and thick field oxide film portions sandwiching the thin silicon oxide film portion. It is also available that the trench groove is formed to extend vertically from the thin silicon oxide film portion into the silicon substrate so that an opening portion of the trench groove is positioned below top portions of the field oxide film portions, and so that an interface between the inter-layer insulator and the first insulation film is sloped down toward the opening portion.

It is optionally available that the first oxide film is formed by the steps of forming a thin oxide film on an entire surface of the epitaxial layer, and then selectively forming thick field oxide films so that the first insulation film comprises a thick field oxide film portion and thin silicon oxide film portions sandwiching the thick field oxide film portion. It is also available that the trench groove is formed to extend vertically from the thick field oxide film portion into the silicon substrate.

It is optionally available to further include the step of forming spacer layers which extend both on the thin silicon oxide film portions and on a part of the thick field oxide film portion so that the inter-layer insulator is formed to extend both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the second isolation film is formed by the step of forming a silicon oxide film both on the first insulation film and on the vertical side walls and the bottom wall of the trench groove.

It is optionally available that the second isolation film is formed by the steps of forming a silicon oxide film both on the first insulation film and on the vertical side walls and the bottom wall of the trench groove, and then forming a silicon nitride film on the silicon oxide film.

It is optionally available that the inter-layer insulator is formed by chemical vapor deposition of an insulation material which shows a fluidity at a high temperature.

It is optionally available that the inter-layer insulator is formed by chemical vapor deposition of boron phosphate silicate glass and subsequent heat treatment at a temperature of approximately 900° C. for about twenty minutes.

The present invention also provides another method for forming a bipolar transistor with trench isolations comprising the following steps. A buried layer is formed on a silicon substrate. An epitaxial layer is formed on the buried layer. A first insulation film is formed on a top surface of the epitaxial layer, wherein the first insulation film comprises at least one thin oxide film portion an at least two thick field oxide film portions sandwiching the above at least one thin oxide film. A base region is selectively formed in an upper region of the epitaxial layer and under the above at least one thin oxide film. An emitter region is selectively formed in an upper region of the base region after an emitter plug electrode is formed on a part of the base region. At least one trench groove is selectively formed which extends vertically from the first insulation film through the epitaxial layer and the buried layer into the silicon substrate. A second insulation film is formed which extends at least on vertical side walls and a bottom wall of the trench groove. A polysilicon film is selectively formed on the second insulation film except on its upper portion so that the polysilicon film fills with the trench groove except for its upper region. An inter-layer insulator is formed which resides not only on the first insulation film but also on the polysilicon film so that the inter-layer insulator fills up the upper region of the trench groove.

According to the above descriptions, the bipolar transistor is formed, before the trench groove is formed and then the trench groove is filled up with the inter-layer insulator. This means that the inter-layer insulator, which fills up the trench groove, is not subjected to the heat treatments for forming the bipolar transistor. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region of the device. No crystal dislocation causes no current leakage nor other deterioration of the device performance.

Even if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the bipolar transistor. This ensures that the trench isolation is free from any impurity diffusions externally from the trench groove into the epitaxial layer. Thus, the device is free of any variation in impurity concentration.

Further as described above, filling up the trench isolation and the formation of the inter-layer insulator are simultaneously made. This results in a considerable reduction, for example, about 70% reduction, in the number of fabrication steps actually carried out for forming the trench isolation.

Furthermore, the above isolation structure is suitable for a trench groove which has a high aspect ratio since it is sufficient to fill up at least the upper portion of the trench groove with the inter-layer insulator. As can be seen, it is generally difficult to fill up the entire part of the trench groove having the large aspect ratio with the inter-layer insulator, even the inter-layer insulator is made of a material which shows a fluidity. Actually, however, when a high density integration of the device is required, then it is also required to reduce the width of the trench groove. The reduction in the width of the trench groove results in a large aspect ratio of the trench groove. The above trench isolation structure is applicable when the trench groove has an extremely large aspect ratio, or an extremely small width.

It is optionally available that the first oxide film is formed by the steps of forming a thin oxide film on an entire surface of the epitaxial layer, and then selectively forming thick field oxide films so that the first insulation film comprises a thin silicon oxide film portion and thick field oxide film portions sandwiching the thin silicon oxide film portion. It is available that the trench groove is formed to extend vertically from the thin silicon oxide film portion into the silicon substrate so that an opening portion of the trench groove is positioned below top portions of the field oxide film portions, and so that an interface between the inter-layer insulator and the first insulation film is sloped down toward the opening portion.

It is optionally available that the first oxide film is formed by the steps of forming a thin oxide film on an entire surface of the epitaxial layer, and then selectively forming thick field oxide films so that the first insulation film comprises a thick field oxide film portion and thin silicon oxide film portions sandwiching the thick field oxide film portion. It is also available that the trench groove is formed to extend vertically from the thick field oxide film portion into the silicon substrate.

It is optionally available to further include the step of forming spacer layers which extend both on the thin silicon oxide film portions and on a part of the thick field oxide film portion so that the inter-layer insulator is formed to extend both on the spacer layers and on the remaining part, which is not covered by the spacer layers, of the field oxide film portion, and so that interfaces of the inter-layer insulator with the spacer layer and with the thick field oxide film portion have steps which are down toward an opening of the trench groove.

It is optionally available that the second isolation film is formed by the step of forming a silicon oxide film both on the first insulation film and on the vertical side walls and the bottom wall of the trench groove.

It is optionally available that the second isolation film is formed by the steps of forming a silicon oxide film both on the first insulation film and on the vertical side walls and the bottom wall of the trench groove, and then forming a silicon nitride film on the silicon oxide film.

It is optionally available that the polysilicon film is formed by chemical vapor deposition of polysilicon and subsequent selective etching the deposited polysilicon.

It is optionally available that the inter-layer insulator is formed by chemical vapor deposition of an insulation material which shows a fluidity at a high temperature.

It is optionally available that the inter-layer insulator is formed by chemical vapor deposition of boron phosphate silicate glass and subsequent heat treatment at a temperature of approximately 900° C. for about twenty minutes.

The present invention furthermore provides a method for forming a MOS field effect transistor with a trench isolation comprising the following steps. An impurity doped well region is formed on a silicon substrate. A first insulation film is formed on a top surface of the impurity doped well region, wherein the first insulation film comprises at least one thick field oxide film portion and at least two thin oxide film portions sandwiching the above at least one thick field oxide film portion. At least two gate electrodes are selectively formed on the above at least two thin film portions. Source/drain diffusion regions are selectively formed in an upper region of the impurity doped well region and under each of the thin oxide film portions, wherein the source/drain diffusion regions sandwiches each of at least two channel regions under the above at least two gate electrodes. A trench groove is selectively formed which extends vertically from the thick field oxide film portion through the impurity doped well region into the silicon substrate. An inter-layer insulator is formed not only over the first insulation film and above the gate electrode but also within the trench groove so that the inter-layer insulator fills up the trench groove.

According to the above descriptions, the MOS transistors are formed, before the trench groove is formed and then the trench groove is filled up with the inter-layer insulator. This means that the inter-layer insulator, which fills up the trench groove, is not subjected to the heat treatments for forming the source/drain diffusion regions. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region. No crystal dislocation causes no current leakage nor other deterioration of the device performance.

Even if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the MOS transistors. This ensures that the trench isolation is free from any impurity diffusions of boron or phosphorus externally from the trench groove into the well regions. Thus, the MOS transistor is free of any variation in impurity concentration of the well region. No variation in impurity concentration of the well region causes no variation in threshold voltage of the MOS transistor.

Further as described above, filling up the trench isolation and the formation of the inter-layer insulator are simultaneously made. This results in a considerable reduction, for example, about 70% reduction, in the number of fabrication steps actually carried out for forming the trench isolation.

It is optionally available that to further include the step of forming, after the above fifth step, a second insulation film both on the first insulation film and on vertical side walls and a bottom wall of the trench groove.

It is optionally available that the above at least two gate electrodes are formed respectively to extend both on the thin silicon oxide film portions and on parts of the thick field oxide film portions so that the inter-layer insulator extends both on the gate electrodes and on the remaining part, which is not covered by the gate electrodes, of the field oxide film portion, and so that a bottom face of the inter-layer insulator positioned above the trench groove has steps which are down toward an opening of the trench groove.

It is optionally available that the inter-layer insulator is formed by chemical vapor deposition of an insulation material which shows a fluidity at a high temperature.

It is optionally available that the inter-layer insulator is formed by chemical vapor deposition of boron phosphate silicate glass and subsequent heat treatment at a temperature of approximately 900° C. for about twenty minutes.

The present invention also provides another method for forming a MOS field effect transistor with a trench isolation comprising the following steps. An impurity doped well region is formed on a silicon substrate. A first insulation film is formed on a top surface of the impurity doped well region, wherein the first insulation film comprises at least one thick field oxide film portion and at least two thin oxide film portions sandwiching the above at least one thick field oxide film portion. At least two gate electrodes are selectively formed on the above at least two thin film portions respectively. Source/drain diffusion regions are selectively formed in an upper region of the impurity doped well region and under each of the thin oxide film portions, wherein the source/drain diffusion regions define each of at least two channel regions under each of the above at least two gate electrodes. A trench groove is selectively formed which extends vertically from the thick field oxide film portion through the impurity doped well region into the silicon substrate. A second insulation film is formed which extends at least on vertical side walls and a bottom wall of the trench groove. A polysilicon film is selectively formed on the second insulation film except on its upper portion so that the polysilicon film fills with the trench groove except for its upper region. An inter-layer insulator is formed which resides not only on the first insulation film but also on the polysilicon film so that the inter-layer insulator fills up the upper region of the trench groove.

According to the above descriptions, the MOS transistor is formed, before the trench groove is formed and then the trench groove is filled up with the inter-layer insulator. This means that the inter-layer insulator, which fills up the trench groove, is not subjected to the heat treatments for forming the MOS transistor. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region of the device. No crystal dislocation causes no current leakage nor other deterioration of the device performance.

Even if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the MOS transistor. This ensures that the trench isolation is free from any impurity diffusions externally from the trench groove into the epitaxial layer. Thus, the MOS transistor is free of any variation in impurity concentration. No variation in impurity concentration causes no variation in threshold voltage of the MOS transistor.

Further as described above, filling up the trench isolation and the formation of the inter-layer insulator are simultaneously made. This results in a considerable reduction, for example, about 70% reduction, in the number of fabrication steps actually carried out for forming the trench isolation.

Furthermore, the above isolation structure is suitable for a trench groove which has a high aspect ratio since it is sufficient to fill up at least the upper portion of the trench groove with the inter-layer insulator. As can be seen, it is generally difficult to fill up the entire part of the trench groove having the large aspect ratio with the inter-layer insulator, even the inter-layer insulator is made of a material which shows a fluidity. Actually, however, when a high density integration of the device is required, then it is also required to reduce the width of the trench groove. The reduction in the width of the trench groove results in a large aspect ratio of the trench groove. The above trench isolation structure is applicable when the trench groove has an extremely large aspect ratio, or an extremely small width.

It is optionally available that the above at least two gate electrodes are formed respectively to extend both on the thin silicon oxide film portions and on parts of the thick field oxide film portions so that the inter-layer insulator extends both on the gate electrodes and on the remaining part, which is not covered by the gate electrodes, of the field oxide film portion, and so that a bottom face of the inter-layer insulator positioned above the trench groove has steps which are down toward an opening of the trench groove.

It is optionally available that the polysilicon film is formed by chemical vapor deposition of polysilicon and subsequent selective etching the deposited polysilicon.

It is optionally available that the inter-layer insulator is formed by chemical vapor deposition of an insulation material which shows a fluidity at a high temperature.

It is optionally available that the inter-layer insulator is formed by chemical vapor deposition of boron phosphate silicate glass and subsequent heat treatment at a temperature of approximately 900° C. for about twenty minutes.

EMBODIMENTS

Figure 7:
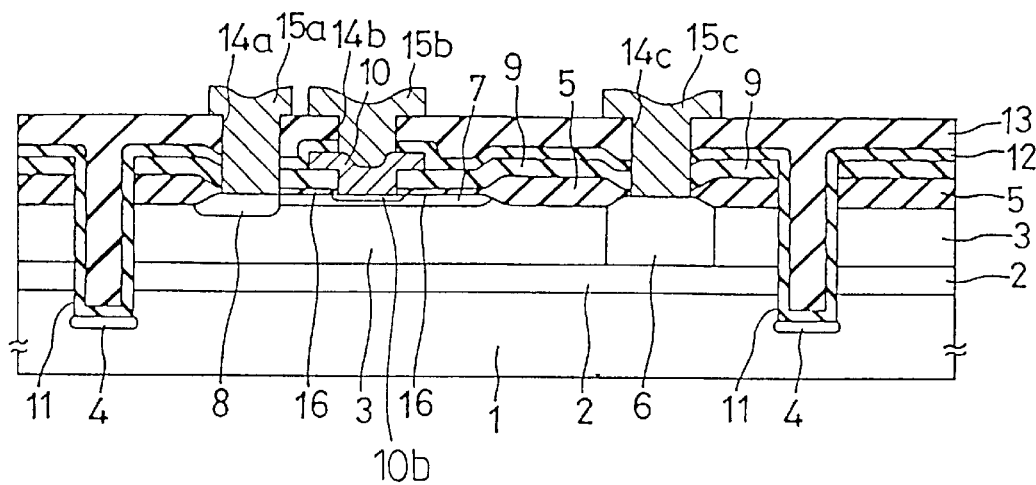
FIG. 7 is a fragmentary cross sectional elevation view illustrative of novel trench isolations which isolate a bipolar transistor formed on a single semiconductor substrate in a first embodiment according to the present invention.

Preferred embodiments of the present invention will be described hereafter. A first embodiment according to the present invention will be described in detail with reference to FIGS. 7 and 8A through 8E. FIG. 7 illustrates novel trench isolations which isolates a bipolar transistor formed on a silicon substrate 1. Descriptions of the trench isolations will follow the structural descriptions of the bipolar transistor.

The bipolar transistor has the following structure. An n-type buried layer 2 is formed on a top surface of a p-type silicon substrate 1. An n-type epitaxial layer 3 is formed on a top surface of the n-type buried layer 2. A thin oxide film 16 is selectively provided in an active region and on a top surface of the n-type epitaxial layer 3. Thick field oxide films 5 are selectively provided in passive regions and on the top surface of the n-type epitaxial layer 3. A p-type base region 7 is selectively formed under the thin oxide film 16 and in an upper region of the n-type epitaxial layer 3. A p-type base plug region 8 is selectively provided under the thin oxide film 16 and in an upper region of the n-type epitaxial layer 3 so that p-type base plug region 8 is adjacent to the p-type base region 7. An n-type emitter region 10b is selectively provided in an upper region of the p-type base region 7. The n-type emitter region 10b is separated by the p-type base region 7 from both the p-type base plug region 8 and the n-type epitaxial layer 3. The thin oxide film 16 has an opening which is positioned over the emitter region 10b so that the emitter region 10b is not covered by the thin oxide film 16, whilst the base region 7 is covered by the thin oxide film 16. The thin oxide film 16 has another opening positioned over the p-type base plug region 8 so that the base plug region 8 is not covered by the thin oxide film 16. An n-type collector diffusion region 6 is selectively formed in the n-type epitaxial layer 3, wherein the collector diffusion region 6 is separated by the n-type epitaxial layer 3 and by the field oxide film 5 from the p-type base region 7. The field oxide film 5 has an opening which is positioned over the collector diffusion region 6 so that the collector diffusion region 6 is not covered by the field oxide film 5. The collector diffusion region 6 and the base plug region 8 are positioned at opposite sides to each other of the base region 7.

A first inter-layer insulator 9 is formed on the field oxide film 5 and on the thin oxide film 16. The first inter-layer insulator 9 has three openings which are positioned over the base plug region 8, the emitter region 10b and the collector diffusion region 6 respectively. Trench grooves 11 are selectively provided which extend vertically from the first inter-layer insulator 9 through the field oxide films 5, the epitaxial layer 3 and the buried layer 2 into the silicon substrate 1. The trench grooves encompasses the bipolar transistor as described above so as to isolate the bipolar transistor from peripheral devices. At the bottom of the trench groove 11, a p$^+$-channel stopper region 4 is formed. A second inter-layer insulator 12 is formed not only on the first inter-layer insulator 9 but also on both vertical side walls and a bottom wall of each the trench groove 11. Similarly to the first inter-layer insulator, the second inter-layer insulator 12 also has three openings which are positioned over the base plug region 8, the emitter region 10b and the collector diffusion region 6 respectively. A third inter-layer insulator 13 is provided on an entire part of the second inter-layer insulator 12 so that the third inter-layer insulator 13 resides not only over the second inter-layer insulator 12 but also within each the trench groove 11. As a result, an entire part of the trench groove 11, whose inside walls are covered by the second inter-layer insulator 12, is completely filled up with the third inter-layer insulator 13.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

The above bipolar transistor with the improved trench isolations may be fabricated as follows.

Figure 8A:
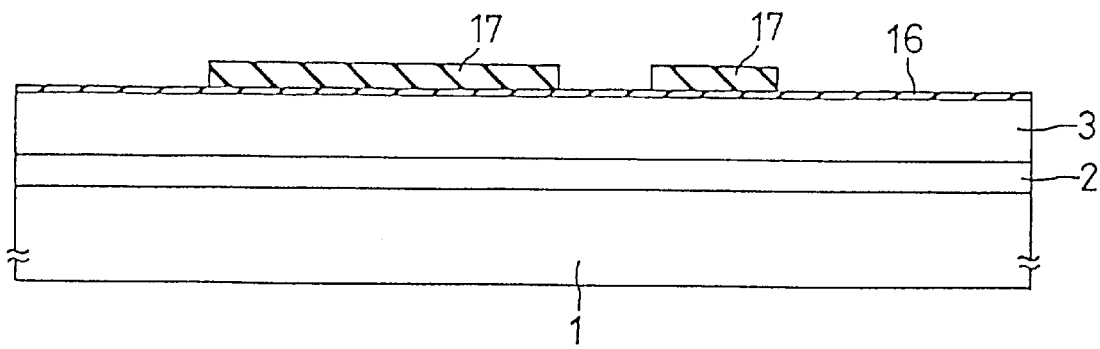
FIGS. 8A through 8E are fragmentary cross sectional elevation views illustrative of novel trench isolations in sequential fabrication steps involved in a novel fabrication method in a first embodiment according to the present invention.

With reference to FIG. 8A, a p-type silicon substrate 1 is prepared having a main face and then an n-type impurity is introduced into the silicon substrate 1. An n-type epitaxial layer 3 is grown on the main face of the silicon substrate 1 by an epitaxial growth method. At this time, an n-type buried layer 2 is also formed under the epitaxial layer 3 due to the n-type impurity which has already introduced in the silicon substrate 1. The epitaxial layer 3 has a main face. A thin oxide film 16 is formed on an entire part of the main face of the epitaxial layer 3. The thin oxide film 16 has a thickness in the range of 20–50 nanometers. A silicon nitride film 17 is selectively formed by photo-lithography on the thin oxide film 16 so that the silicon nitride film 17 covers active regions on which base, emitter and collector regions are planed to be formed later. The silicon nitride film 17 has a thickness in the range of 100–200 nanometers.

Figure 8B:
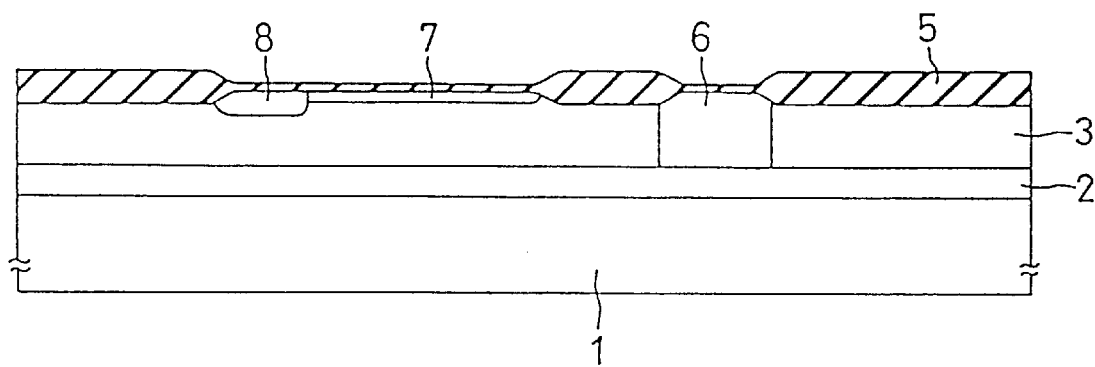

With reference to FIG. 8B, field oxide films 5 are selectively formed by a thermal oxidation of silicon using the silicon nitride film 17 as a heat resistive mask so that the field oxide films 5 reside passive regions which are not covered by the silicon nitride films 17. The silicon nitride films 17 used are then removed. A photo-resist pattern not illustrated is formed by photo-lithography on the field oxide films 5 and the thin oxide film 16. Phosphorus is selectively introduced into a part of the epitaxial layer 3 by an ion-implantation using the photo-resist pattern as a mask. The ion-implantation is carried out under the following conditions. An acceleration energy is 30 KeV. A dose is $5 \times 10^{15}$ cm$^{-2}$. The above photo-resist pattern used is then removed.

Following to the above ion-implantation, the substrate 1 is subjected to an annealing in a nitrogen atmosphere at a temperature of 950° C. for twenty minutes. As a result, an n-type collector diffusion region 6 is formed in the epitaxial layer 3. The bottom of the collector diffusion region 6 is positioned at the same level as an interface between the epitaxial layer 3 and the buried layer 2.

Following to the above annealing process, another photo-resist pattern not illustrated is formed by photo-lithography on the field oxide films 5 and the thin oxide film 16. Boron is selectively introduced into an upper region of the epitaxial layer 3 by an ion-implantation using the photo-resist pattern as a mask. The ion-implantation is carried out under the following conditions. An acceleration energy is set at about 20 KeV so that a p-n junction depth is in the range of 150–200 nanometers. A dose is $5 \times 10^{15}$ cm$^{-2}$. As a result, an intrinsic base region 7 is formed in the upper region of the epitaxial layer 3. The above photo-resist pattern used is then removed.

Subsequently, still another photo-resist pattern not illustrated is formed by photo-lithography on the field oxide films 5 and the thin oxide film 16. $BF_2$ is selectively introduced into a part of the intrinsic base region 7 by an ion-implantation using the photo-resist pattern as a mask. The ion-implantation is carried out under the following conditions. An acceleration energy is 70 KeV. A dose is $5\times10^{15}$ cm$^{-2}$. As a result, a p-type base plug region 8 is formed. The above photo-resist pattern used is then removed. Following to the above ion-implantation process, the substrate 1 is subjected to a heat treatment at a temperature of 900° C. for twenty minutes in order to obtain both recovery of damages due to the ion-implantation carried out and activation of the p-type impurity, namely boron.

Figure 8C:
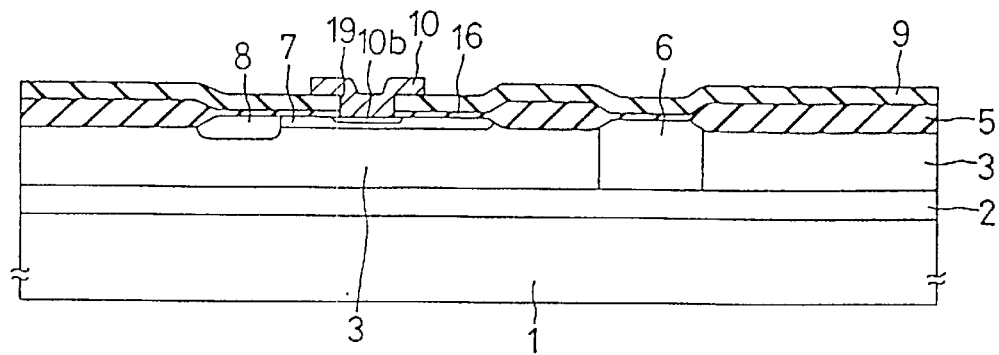

With reference to FIG. 8C, a first inter-layer insulator 9 made of silicon oxide is deposited by chemical vapor deposition on an entire surface of the substrate to cover the field oxide films 5 and the thin oxide film 16. The first inter-layer insulator 9 and the thin oxide film 16 are selectively etched by an anisotropic etching such as reactive ion-etching so that an emitter plug contact hole 19 is formed and a part of the intrinsic base region 7 is exposed through the emitter plug contact hole 19.

A polysilicon film is entirely deposited by chemical vapor deposition on the first inter-layer insulator 9 and within the emitter plug contact hole 19. The polysilicon film has a thickness of about 200 nanometers. The polysilicon film deposited is then patterned by photo-lithography so that the polysilicon film remains within the emitter plug contact hole 19 and on the first inter-layer insulator 9 in the vicinity of the emitter plug contact hole 19. The remaining polysilicon film is then introduced with an n-type impurity of As by an ion-implantation at an acceleration energy of 70 KeV and a dose of $1\times10^{16}$ cm$^{-2}$ thereby allowing the remaining polysilicon film to act as an emitter plug electrode 10. Subsequently, the substrate 1 is subjected to a heat treatment in a nitrogen atmosphere at a temperature of 900° C. for twenty minutes in order to cause diffusion of the impurity As from the emitter plug electrode 10 into a part of the intrinsic base region 7 in contact with the emitter plug electrode 10. As a result, an emitter region 10b is formed in an upper region of the intrinsic base region 7 in contact with the emitter plug electrode 10.

Figure 8D:
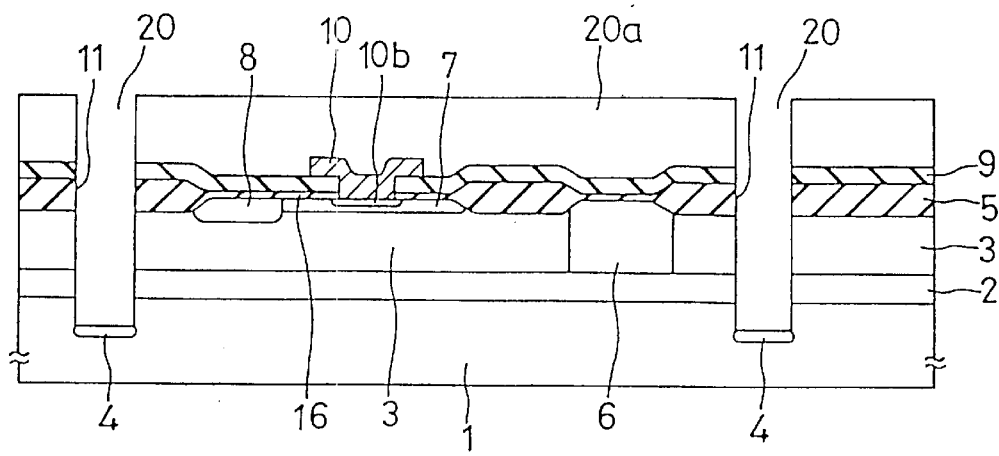

With reference to FIG. 8D, a photo resist film 20a is formed to cover an entire surface of the substrate. Openings 20 are formed in the photo resist film 20a. The openings 20 are positioned over the field oxide films 5 which encompass the bipolar transistor. As a result, parts of the first inter-layer insulator 9 over the field oxide films 5 are exposed through the openings 20 of the photo-resist film 20a. The first inter-layer insulator 9 and the field oxide films 5 are partially removed by a dry etching process using the photo-resist film 20a with the openings 20 as a mask so that parts of the epitaxial layer 3, which are positioned under the openings 20, are exposed. The epitaxial layer 3, the buried layer 2 and the silicon substrate 1 are partially etched by the dry etching process using the photo-resist film 20a with the openings as a mask so that trench grooves 11 are formed which extend vertically from the first inter-layer insulator 9 through the field oxide films 5, the epitaxial layer 2 and the buried layer 2 into the silicon substrate 1. The depth of the trench groove 11 is in the range of 3–5 micrometers. The above dry etching was carried out using $SiCl_4$, $SF_6$, and $N_2$ as etching gases, wherein flow rates of $SiCl_4$, $SF_6$, and $N_2$ are 15 sccm, 5 sccm and 5 sccm respectively. A discharge power is 500 W. Subsequently, boron is implanted using the photo-resist film 20a with the openings 20 as a mask and under the condition of an acceleration energy in the range of 10–30 KeV and a dose in the range of $1\times10^{13}$ cm$^{-2}$ to $1\times10^{14}$ cm$^{-2}$. As a result, p-type channel stopper regions 4 are formed under the bottoms of the trench grooves 11.

Figure 8E:
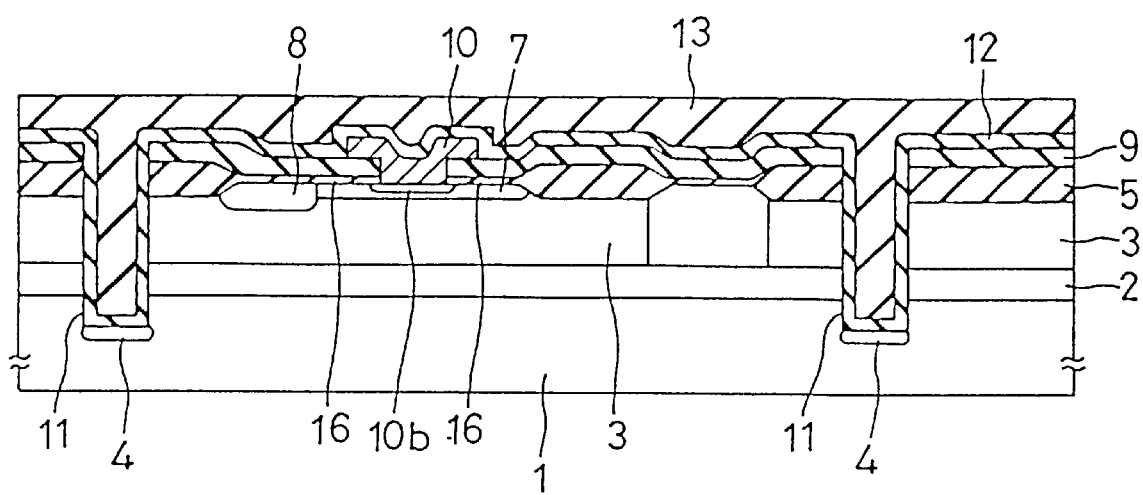

With reference to FIG. 8E, the photo-resist film 20a used is then removed. A second inter-layer insulator 12 made of an impurity-free material showing no fluidity such as silicon oxide is entirely formed by chemical vapor deposition not only to cover both the first inter-layer insulator 9 and the emitter plug electrode 10 but also to cover both vertical side walls and a bottom wall of each the trench groove 11. The second inter-layer insulator 12 has a thickness in the range of 50–150 nanometers. Subsequently, a third inter-layer insulator 13 made of a different material showing a fluidity such as boron phosphate silicate glass is entirely deposited by chemical vapor deposition on an entire surface of the second inter-layer insulator 12 so that the third inter-layer insulator 13 resides no only over the second inter-layer insulator 12 but also within the trench groove 11. As a result, the trench grooves 11 are completely filled up with the third inter-layer insulator 13. The substrate is then subjected to a heat treatment in a nitrogen atmosphere at a temperature of 900° C. for twenty minutes in order to cause planarization of the surface of the third inter-layer insulator 13. As a modification, in this heat treatment process, the emitter region may be formed by the impurity diffusion from the emitter plug electrode 10 into the upper region of the intrinsic base region 7.

With reference back to FIG. 7, the third, second and first inter-layer insulators 13, 12 and 9, and further the thin oxide film 16 are in turn and selectively etched by photo-lithography so that a base contact hole 14a, an emitter contact hole 14b and a collector contact hole 14c are formed. The base contact hole 14a is positioned over the base plug region 8 so that the base plug region 8 is exposed through the base contact hole 14a. The emitter contact hole 14b is positioned over the emitter plug electrode 10 so that the emitter plug electrode 10 is exposed through the emitter contact hole 14b. The collector contact hole 14c is positioned over the collector diffusion region 6 so that the collector diffusion region 6 is exposed through the collector contact hole 14c. An aluminum alloy film is deposited by sputtering on an entire surface of the substrate and within the base, emitter and collector holes 14a, 14b and 14c. The aluminum alloy film is patterned to form a base wiring layer 15a in the base contact hole 14a, an emitter wiring layer 15b in the emitter contact hole 14b, and a collector wiring layer 15c in the collector contact hole 14c. As a result, the fabrication processes are completed.

According to the above descriptions, the base, emitter and collector regions of the bipolar transistor are formed, before the trench grooves are formed and then the trench grooves are filled up with the inter-layer insulators. This means that the inter-layer insulator, which fills up the trench groove, is not subjected to the heat treatments for forming the collector, base and emitter regions. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region. No crystal dislocation causes no current leakage nor other deterioration of the device performance.

Even if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the formation of the trench isolation is made after the formation of the bipolar transistor. This ensures that the trench isolation is free from any impurity diffusions of boron or phosphorus externally from the trench groove into the epitaxial layer. Thus, the bipolar transistor is free of any variation in impurity concentration of the epitaxial layer acting as a collector region.

Further as described above, filling up the trench isolation and the formation of the inter-layer insulator are simultaneously made. This results in a considerable reduction, for example, about 70% reduction, in the number of fabrication steps actually carried out for forming the trench isolation.

The above novel trench isolation provides the same collector-substrate parasitic capacitance as the conventional one.

Figure 9:
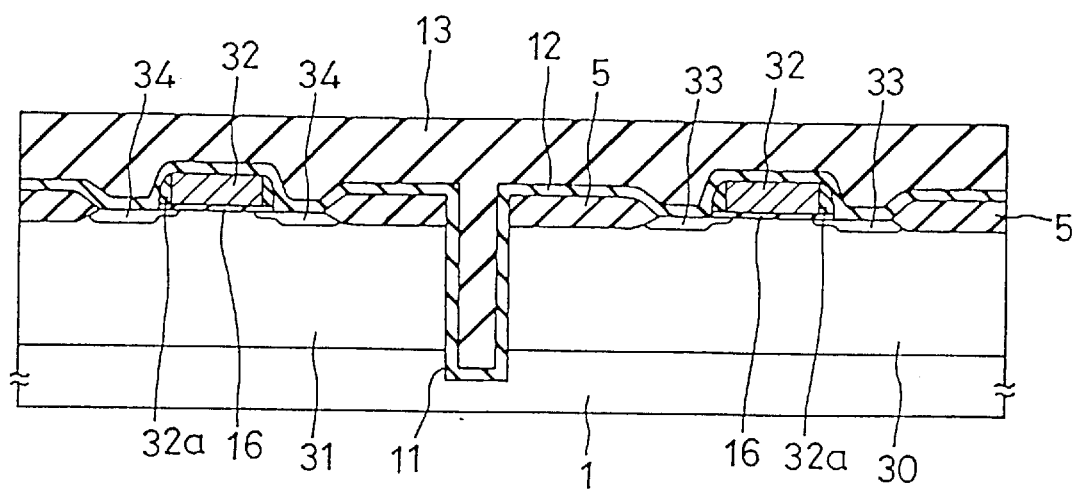
FIG. 9 is a fragmentary cross sectional elevation view illustrative of a novel trench isolation which isolates n-channel and p-channel MOS transistors formed on a single semiconductor substrate in a second embodiment according to the present invention.

A second embodiment according to the present invention will be described with reference to FIGS. 9 and 10A through 10C. FIG. 9 illustrates a novel isolation structure which isolate n-channel and p-channel MOS transistors formed on a single silicon substrate 1. A p-type well region 30 and an n-type well region 31 are formed on a p-type silicon substrate 1. The p-type and n-type well regions 30 and 31 are isolated by the trench groove 11. Field oxide films 5 are selectively provided to define active regions respectively for the n-channel and p-channel MOS transistors. For n-channel MOS transistor, n-type source/drain diffusion regions 33 are selectively formed in an active region of an upper region of the p-type well region 30. For p-channel MOS transistor, p-type source/drain diffusion regions 34 are selectively formed in an active region of an upper region of the n-type well region 31. The n-type source/drain diffusion regions 33 have n-type lightly doped diffusion regions. The p-type source/drain diffusion regions 34 have p-type lightly doped diffusion regions. The n-type source/drain diffusion regions 33 define an n-channel region. The p-type source/drain diffusion regions 34 define a p-channel region. Gate oxide films 16 are formed, one of which extends on the n-channel region and the n-type lightly diffusion regions and another extends on the p-channel region and the p-type lightly diffusion regions. Gate electrodes 32 are formed on the gate oxide films 16 and over the n-channel and p-channel regions. Gate side wall oxide films 32a are provided at opposite sides of each of the gate electrodes 32 and on the gate oxide film 16. The gate side wall oxide films 32a are positioned over each of the lightly doped diffusion regions.

A trench groove 11 is provided which extends vertically from the field oxide film 5 through the well region into the silicon substrate 1. The bottom of the trench groove 11 lies below an interface between the substrate 1 and the well regions 30 and 31. A first inter-layer insulator 12 made of a material showing no fluidity is entirely provided which extends not only on the field oxide film 5, the n-type and p-type source/drain diffusion regions 33 and 34, the gate side wall oxide films 32a and the gate electrodes 32, but also on vertical side walls and a bottom wall of the trench groove 11. A second inter-layer insulator 13 made of a material showing a fluidity is provided which extends on an entire surface of the first inter-layer insulator 12 so that the second inter-layer insulator 13 resides not only over the n-channel and p-channel MOS transistors but also within the trench groove 11 whereby the trench groove 11 covered by the first inter-layer insulator 12 is completely filled up with the second inter-layer insulator 13.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

The above MOS transistors isolated by the trench isolation are fabricated as follows, wherein the trench isolation is formed after the n-channel and p-channel MOS transistors are formed.

Figure 10A:
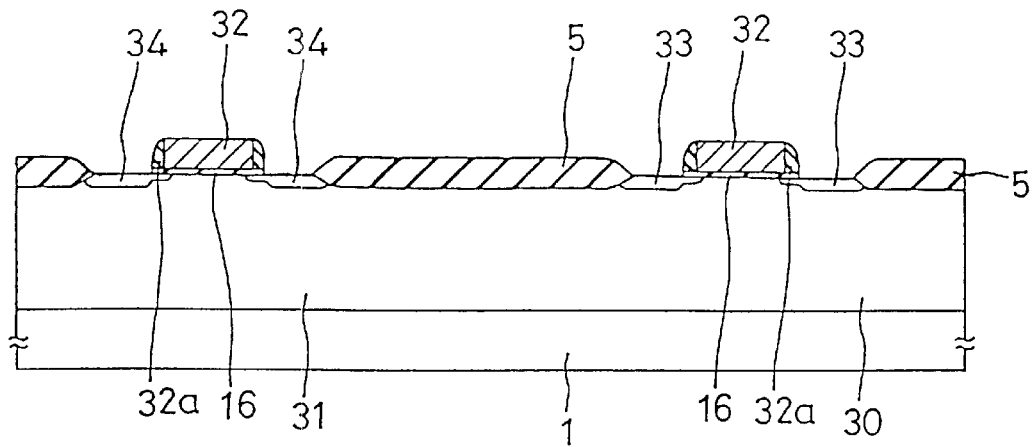
FIGS. 10A through 10C are fragmentary cross sectional elevation views illustrative of novel trench isolations in sequential fabrication steps involved in a novel fabrication method in a second embodiment according to the present invention.

With reference to FIG. 10A, an n-type well region 31 is selectively formed in a part of the upper region of the p-type silicon substrate 1 so that a p-type well region 30 is defined. A thin oxide film is formed on an entire surface of the n-type and p-type well regions 31 and 30. Field oxide films are selectively formed on the surfaces of the p-type and n-type well regions 30 and 31 to define active and passive regions. Gate electrodes 32 are selectively formed on the thin oxide films in the active regions. By ion-implantations using the gate electrodes 32 as masks, n-type and p-type lightly doped diffusion regions are formed in upper regions under the thin oxide films 16 on the active regions. Gate side wall oxide films 32a are formed at opposite sides of respective gate electrodes 32. Additional ion-implantations using the gate electrodes with the gate side wall oxide films 32 as masks are carried out for subsequent heat treatments to cause the diffusions of the p-type and n-type impurities to thereby form n-type and p-type source/drain diffusion regions 33 and 34.

Figure 10B:
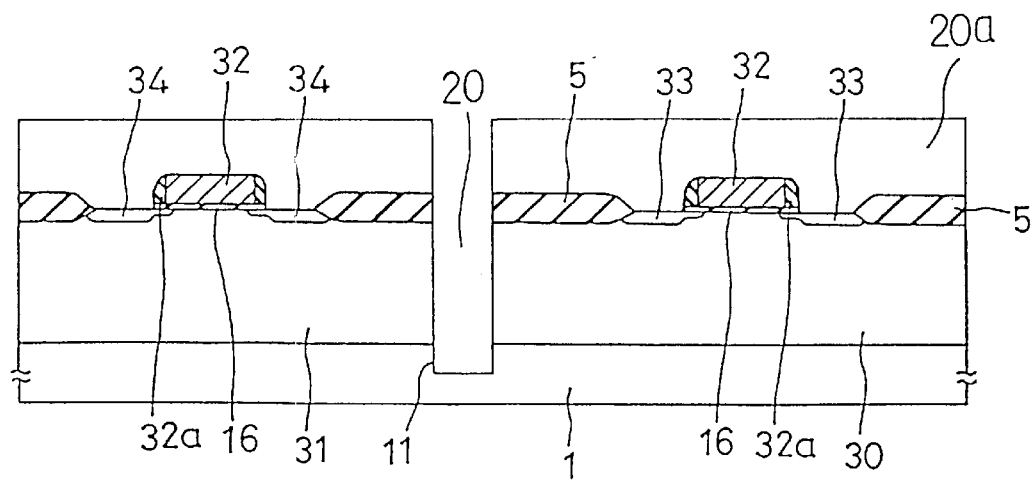

With reference to FIG. 10B, a trench groove 11 is formed which extends vertically from the field oxide film 5 through the boundary of the p-type and n-type well regions into the silicon substrate 1.

Figure 10C:
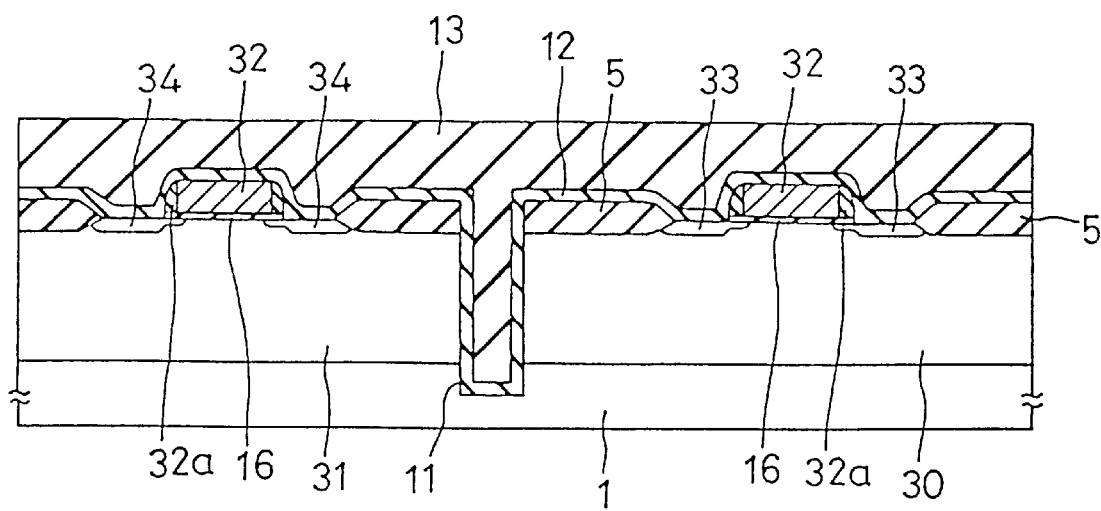

With reference to FIG. 10C, a first inter-layer insulator 12 made of a material showing no fluidity is entirely deposited by chemical vapor deposition to extend not only on the field oxide film 5, the n-type and p-type source/drain diffusion regions 33 and 34, the gate side wall oxide films 32a and the gate electrodes 32, but also on vertical side walls and a bottom wall of the trench groove 11. A second inter-layer insulator 13 made of a material showing a fluidity is entirely deposited by chemical vapor deposition to extend on an entire surface of the first inter-layer insulator 12 so that the second inter-layer insulator 13 resides not only over the n-channel and p-channel MOS transistors but also within the trench groove 11 whereby the trench groove 11 covered by the first inter-layer insulator 12 is completely filled up with the second inter-layer insulator 13.

According to the above descriptions, the MOS transistors are formed, before the trench groove is formed and then the trench groove is filled up with the inter-layer insulator. This means that the inter-layer insulator, which fills up the trench groove, is not subjected to the heat treatments for forming the source/drain diffusion regions. This means that the trench isolation is free from any thermal expansion due to the above heat treatment. This ensures that no thermal stress is caused at any positions around the trench isolation. Thus, no thermal stress causes no crystal defect at any positions around the trench isolation. No crystal defect causes no crystal dislocation which extends along an interface between the silicon layer and the silicon oxide film and reaches an active region. No crystal dislocation causes no current leakage nor other deterioration of the device performance.

Even if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage or other deterioration of the device performance.

As described above, the formation of the trench isolation is made after the formation of the MOS transistors. This ensures that the trench isolation is free from any impurity diffusions of boron or phosphorus externally from the trench groove into the well regions. Thus, the MOS transistor is free of any variation in impurity concentration of the well region. No variation in impurity concentration of the well region causes no variation in threshold voltage of the MOS transistor.

Further as described above, filling up the trench isolation and the formation of the inter-layer insulator are simultaneously made. This results in a considerable reduction, for example, about 70% reduction, in the number of fabrication steps actually carried out for forming the trench isolation.

Figure 11:
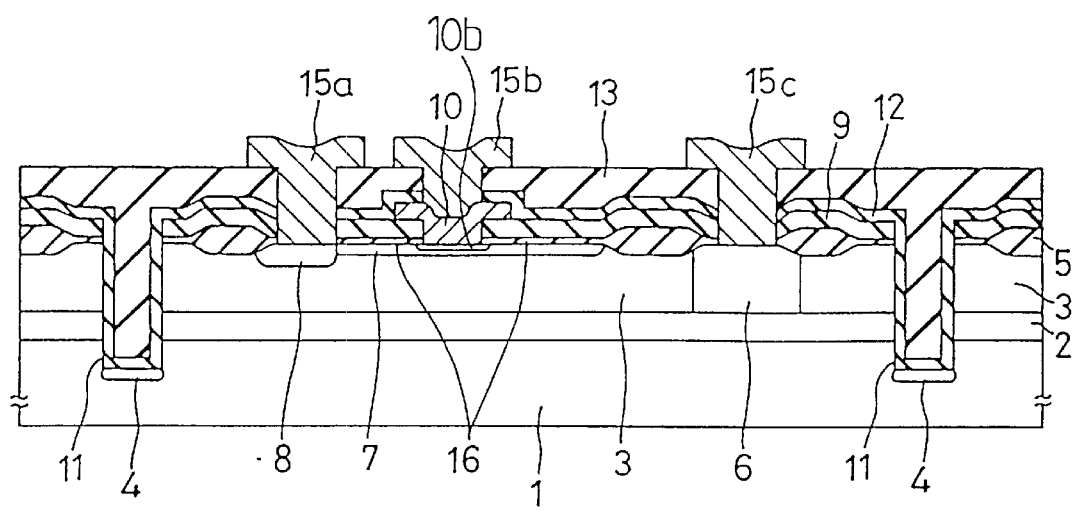
FIG. 11 is a fragmentary cross sectional elevation view illustrative of another novel trench isolations which isolate a bipolar transistor formed on a single semiconductor substrate in a third embodiment according to the present invention.
Figure 12:
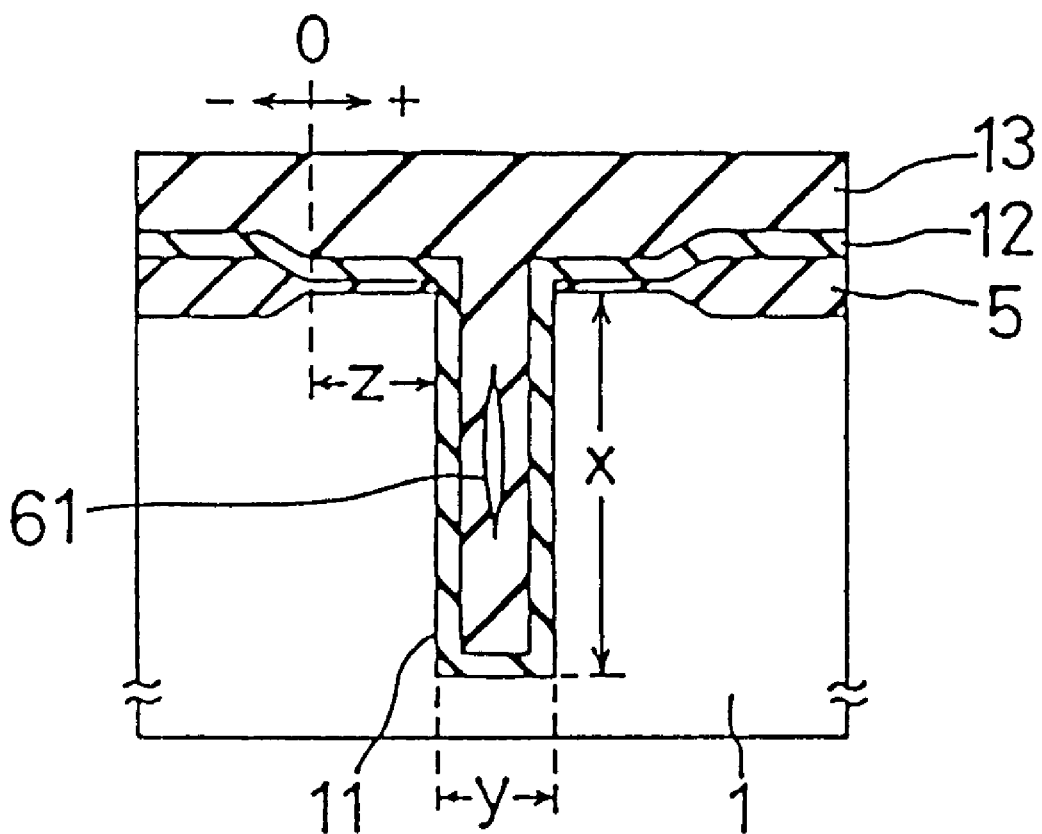
FIG. 12 is a fragmentary cross sectional elevation view illustrative of advantages of another novel trench isolations in a third embodiment according to the present invention.

A third embodiment according to the present invention will be described with reference to FIGS. 11 and 12. FIG. 11 illustrates novel trench isolation structures which isolates the bipolar transistor. The structure of the bipolar transistor isolated by the trench isolations in the third embodiment are the same as the first embodiment except in providing the trench grooves at thin oxide films between the field oxide films.

The bipolar transistor has the following structure. An n-type buried layer 2 is formed on a top surface of a p-type silicon substrate 1. An n-type epitaxial layer 3 is formed on a top surface of the n-type buried layer 2. A thin oxide film 16 is selectively provided in an active region and on a top surface of the n-type epitaxial layer 3. Thick field oxide films 5 are selectively provided in passive regions and on the top surface of the n-type epitaxial layer 3. A p-type base region 7 is selectively formed under the thin oxide film 16 and in an upper region of the n-type epitaxial layer 3. A p-type base plug region 8 is selectively provided under the thin oxide film 16 and in an upper region of the n-type epitaxial layer 3 so that p-type base plug region 8 is adjacent to the p-type base region 7. An n-type emitter region 10b is selectively provided in an upper region of the p-type base region 7. The n-type emitter region 10b is separated by the p-type base region 7 from both the p-type base plug region 8 and the n-type epitaxial layer 3. The thin oxide film 16 has an opening which is positioned over the emitter region 10b so that the emitter region 10b is not covered by the thin oxide film 16, whilst the base region 7 is covered by the thin oxide film 16. The thin oxide film 16 has another opening positioned over the p-type base plug region 8 so that the base plug region 8 is not covered by the thin oxide film 16. An n-type collector diffusion region 6 is selectively formed in the n-type epitaxial layer 3, wherein the collector diffusion region 6 is separated by the n-type epitaxial layer 3 and by the field oxide film 5 from the p-type base region 7. The field oxide film 5 has an opening which is positioned over the collector diffusion region 6 so that the collector diffusion region 6 is not covered by the field oxide film 5. The collector diffusion region 6 and the base plug region 8 are positioned at opposite sides to each other of the base region 7.

A first inter-layer insulator 9 is formed on the field oxide film 5 and on the thin oxide film 16. The first inter-layer insulator 9 has three openings which are positioned over the base plug region 8, the emitter region 10b and the collector diffusion region 6 respectively. Trench grooves 11 are selectively provided which extend vertically from the first inter-layer insulator 9 through the thin oxide films 16, the epitaxial layer 3 and the buried layer 2 into the silicon substrate 1. The opening of the trench groove 11 is positioned below the top of the first inter-layer insulator 9 over the field oxide film 5. In other words, when the trench groove 11 is formed at the thin oxide film 16, then the level of the opening of the trench groove is lower than when the trench groove 11 were provided at the thick field oxide film 5. On the other hand, when the trench groove 11 is provided at the thin oxide film 16, then the level of the bottom of the trench groove 11 is the same as when the trench groove 11 is provided at the thick field oxide film 5. This means that when the trench groove is formed at the thin oxide film 16, the depth of the trench groove 11 is smaller than that when the trench groove 11 is formed at the thick field oxide film 5. This means that the aspect ratio of the trench groove 11 provided at the thin oxide film 16 is smaller than that when the trench groove is provided at the thick field oxide film 5. The small aspect ratio of the trench groove facilitates filling up the trench groove with the inter-layer insulator. When an extremely high density integration is required, a small width of the trench groove is required. This makes the aspect ratio of the trench groove large. It is generally difficult to fill up the trench groove having a large aspect ratio without any cavity. Providing the trench groove at the thin oxide film, however, makes the aspect ratio small thereby resulting in a facilitation of filling up the trench groove with the small width. The trench grooves encompasses the bipolar transistor as described above so as to isolate the bipolar transistor from peripheral devices. At the bottom of the trench groove 11, a p⁺-channel stopper region 4 is formed. A second inter-layer insulator 12 is formed not only on the first inter-layer insulator 9 but also on both vertical side walls and a bottom wall of each the trench groove 11. Similarly to the first inter-layer insulator, the second inter-layer insulator 12 also has three openings which are positioned over the base plug region 8, the emitter region 10b and the collector diffusion region 6 respectively. A third inter-layer insulator 13 is provided on an entire part of the second inter-layer insulator 12 so that the third inter-layer insulator 13 resides not only over the second inter-layer insulator 12 but also within each the trench groove 11. As a result, an entire part of the trench groove 11, whose inside walls are covered by the second inter-layer insulator 12, is completely filled up with the third inter-layer insulator 13.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the opening of the trench groove 11 is positioned below the top of the first inter-layer insulator 9 over the field oxide film 5. In other words, when the trench groove 11 is formed at the thin oxide film 16, then the level of the opening of the trench groove is lower than when the trench groove 11 were provided at the thick field oxide film 5. On the other hand, when the trench groove 11 is provided at the thin oxide film 16, then the level of the bottom of the trench groove 11 is the same as when the trench groove 11 is provided at the thick field oxide film 5. This means that when the trench groove is formed at the thin oxide film 16, the depth of the trench groove 11 is smaller than that when the trench groove 11 is formed at the thick field oxide film 5. This means that the aspect ratio of the trench groove 11 provided at the thin oxide film 16 is smaller than that when the trench groove is provided at the thick field oxide film 5. The small aspect ratio of the trench groove facilitates filling up the trench groove with the inter-layer insulator. When an extremely high density integration is required, a small width of the trench groove is required. This makes the aspect ratio of the trench groove large. It is generally difficult to fill up the trench groove having a large aspect ratio without any cavity. Generally, when the trench groove having the large aspect ratio is filled with the inter-layer insulator made of a material showing a fluidity, then any cavity is likely to be formed as illustrated in FIG. 12. Providing the trench groove at the thin oxide film, however, makes the aspect ratio small thereby resulting in a facilitation of filling up the trench groove with the small width.

Further, the second inter-layer insulator 12 has slopes which are positioned over slopes in boundary areas between the thick field oxide film 5 and the thin oxide film 16. The slopes become down toward the opening of the trench groove 11. This down slope toward the opening of the trench groove further facilitates filling up the trench groove having a large aspect ratio. In order to facilitate filling up the trench groove, it is preferable that the down slope toward the opening of the trench groove 11 is closed to the opening. In this embodiment, even if the aspect ratio of the trench groove is not less than 3, then it is possible to fill up the trench groove without any cavity. However, a distance between the opening of the trench groove and the down slope is preferably in the range of 1–2 micrometers.

TABLE 1

| Distance (μ m) | +3 | +2 | +1 | 0 | −1 | −2 |
|---|---|---|---|---|---|---|
| Cavity | none | none | none | partially | partially | entirely | where the trench groove has a width of 0.8 micrometers and a depth of 3.2 micrometers and thus the aspect ratio of 4. When the distance is minus, this means that the trench groove is provided at the field oxide film.

Figure 14:
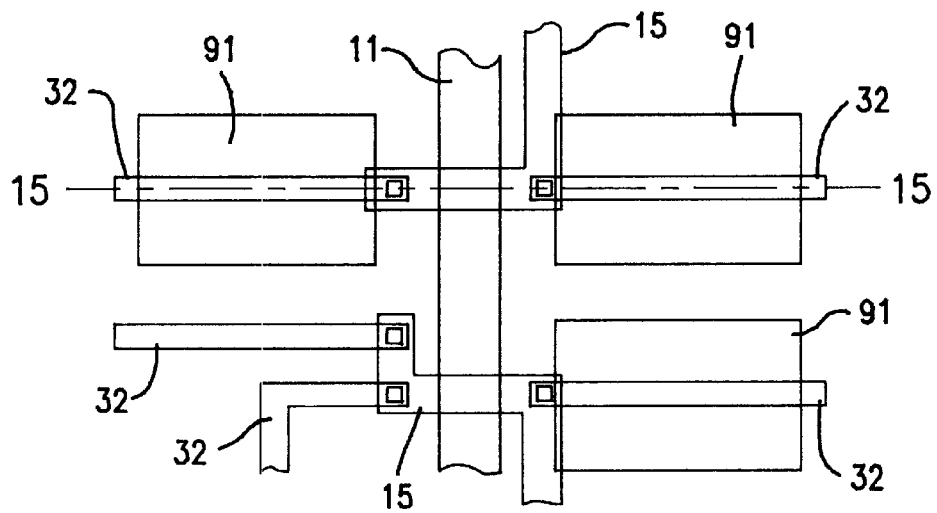
FIG. 14 is a fragmentary plane view illustrative of another novel trench isolation of two MOS transistors formed on a single semiconductor substrate in a fourth embodiment according to the present invention.
Figure 13:
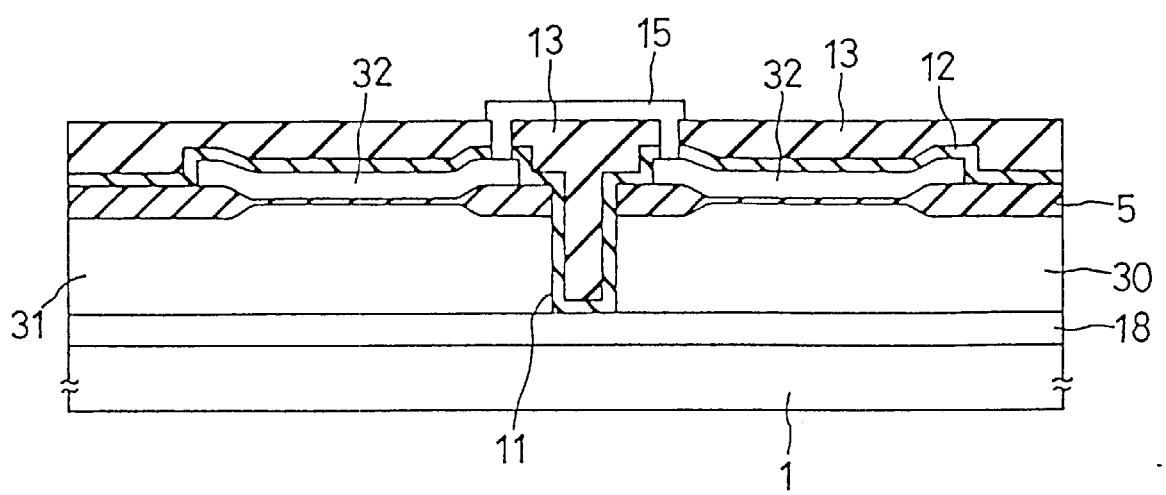
FIG. 13 is a fragmentary cross sectional elevation view illustrative of another novel trench isolation of two MOS transistors formed on a single invention.

A fourth embodiment according to the present invention, will be described with reference to FIG. 13. A trench isolation is provided which isolates n-channel and p-channel MOS transistors formed on a single substrate. A buried oxide film 18 is formed on a silicon substrate 1. On the buried oxide film 18, p-type and n-type well regions 30 and 31 are formed which are isolated from each other by a trench groove 11. On surfaces of the p-type and n-type well regions 30 and 31, gate oxide films and field oxide films are selectively formed. The trench groove 11 extends vertically from the field oxide film through the boundary of the p-type and n-type well regions 30 and 31 to reach the buried isolation layer 18. As a result, the p-type and n-type well regions 30 and 31 are completely isolated by the trench isolation 11 and the buried oxide film 18. Gate oxide films 32 are provided which extend not only on the gate oxide films but also partially on the field oxide films. A first inter-layer insulator 12 is provided which extends not only on the field oxide films and the gate electrodes 32 but also on vertical side walls and a bottom wall of the trench groove 11. The first inter-layer insulator 12 has steps which are down toward the opening of the trench groove 11, wherein the steps are positioned over the field oxide film and in the vicinity of the opening of the trench groove. A second inter-layer insulator 13 is provided not only over the first inter-layer insulator 12 but also within the trench groove 11 covered by the first-inter layer insulator 12. The gate electrodes are connected by interconnections 15. FIG. 14 illustrates a plane structure of the above device. The field oxide films define active regions 91.

According to the above descriptions, if the trench isolation filled with the inter-layer insulator were subjected to any heat treatment, the thermal stress is uniformly applied to the entire part of the trench isolation for the following reasons. As described above, any parts of the trench groove are filled with the uniform material, for example, the inter-layer insulator. This causes substantially no difference in thermal expansion at any positions around the trench isolation. No difference in thermal expansion means that any parts of the trench isolation are applied with the uniform thermal stress due to the uniform thermal expansion. Therefore, no stress concentration is caused at any positions around the trench isolation. No stress concentration prevents formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the opening of the trench groove 11 is positioned below the top of the first inter-layer insulator 9 over the gate electrode 32. The above step makes the depth of the trench groove 11 small. This results in a reduction of the aspect ratio of the trench groove 11. The reduction in the aspect ratio of the trench groove facilitates filling up the trench groove. The steps which are down toward the opening of the trench groove 11 may also facilitate filling up the trench groove. When an extremely high density integration is required, a small width of the trench groove is required. This makes the aspect ratio of the trench groove large. In order to facilitate filling up the trench groove of a large aspect ratio, it is preferable that the down slope toward the opening of the trench groove 11 is closed to the opening.

A fifth embodiment according to the present invention will be described with reference to FIGS. 15A through 15C. Trench isolations isolating a bipolar transistor have the same structure except for the followings. Trench grooves are provided at thin oxide films between thick field oxide films and each the trench grooves is filled with an inter-layer insulator in its upper regions only, whilst the remaining lower region of the trench groove is filled with a polysilicon.

Figure 15A:
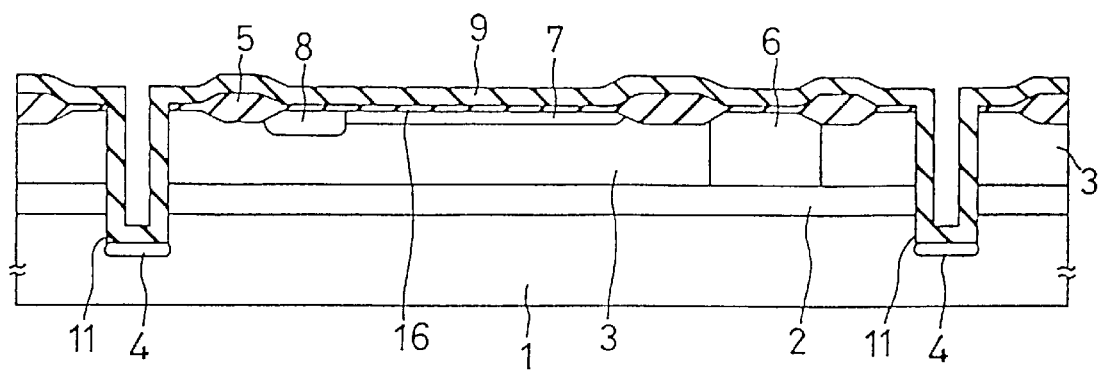
FIGS. 15A through 15C are fragmentary cross sectional elevation views illustrative of novel trench isolations which isolate a bipolar transistor in sequential fabrication steps involved in a novel fabrication method in a fifth embodiment according to the present invention.
Figure 15B:
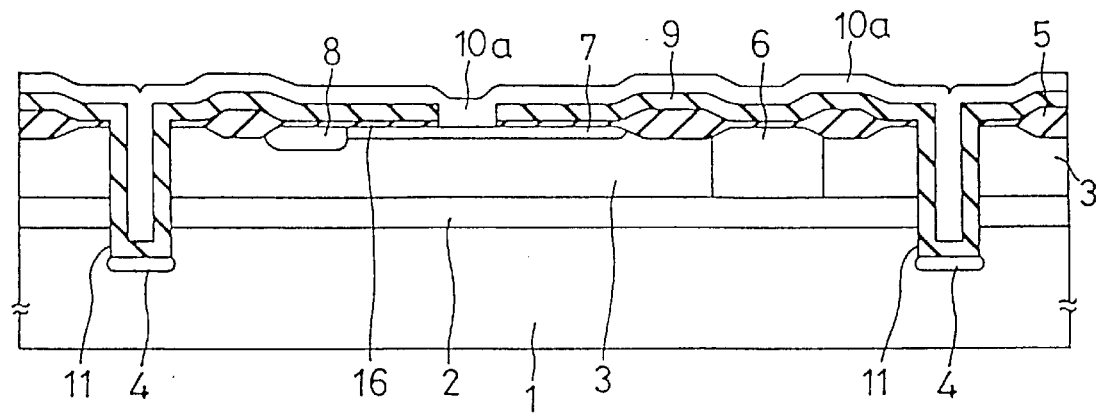
Figure 15C:
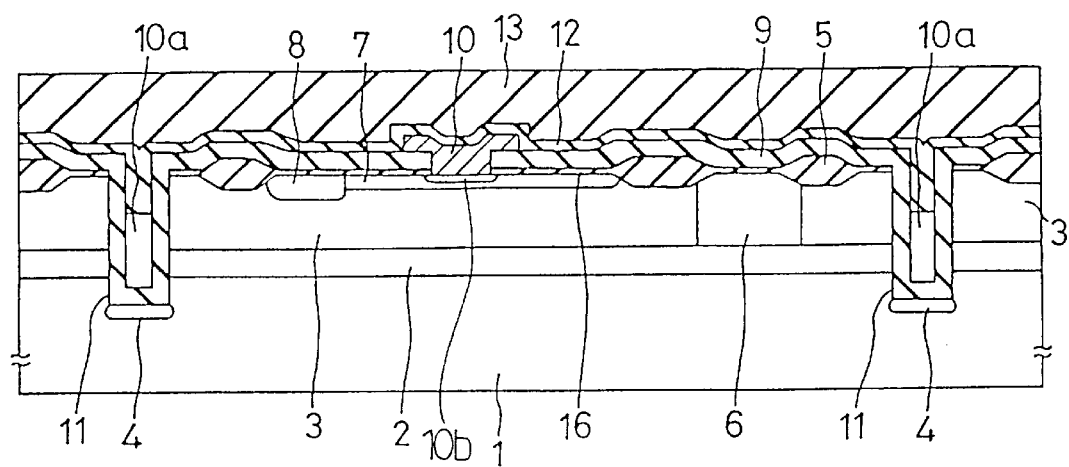

The trench isolations isolating the bipolar transistor have the following structure as illustrated in FIG. 15C. An n-type buried layer 2 is formed on a top surface of a p-type silicon substrate 1. An n-type epitaxial layer 3 is formed on a top surface of the n-type buried layer 2. A thin oxide film 16 is selectively provided in an active region and on a top surface of the n-type epitaxial layer 3. Thick field oxide films 5 are selectively provided in passive regions and on the top surface of the n-type epitaxial layer 3. A p-type base region 7 is selectively formed under the thin oxide film 16 and in an upper region of the n-type epitaxial layer 3. A p-type base plug region 8 is selectively provided under the thin oxide film 16 and in an upper region of the n-type epitaxial layer 3 so that p-type base plug region 8 is adjacent to the p-type base region 7. An n-type emitter region 10b is selectively provided in an upper region of the p-type base region 7. The n-type emitter region 10b is separated by the p-type base region 7 from both the p-type base plug region 8 and the n-type epitaxial layer 3. The thin oxide film 16 has an opening which is positioned over the emitter region 10b so that the emitter region 10b is not covered by the thin oxide film 16, whilst the base region 7 is covered by the thin oxide film 16. The thin oxide film 16 has another opening positioned over the p-type base plug region 8 so that the base plug region 8 is not covered by the thin oxide film 16. An n-type collector diffusion region 6 is selectively formed in the n-type epitaxial layer 3, wherein the collector diffusion region 6 is separated by the n-type epitaxial layer 3 and by the field oxide film 5 from the p-type base region 7. The field oxide film 5 has an opening which is positioned over the collector diffusion region 6 so that the collector diffusion region 6 is not covered by the field oxide film 5. The collector diffusion region 6 and the base plug region 8 are positioned at opposite sides to each other of the base region 7.

Trench grooves 11 are selectively provided which extend vertically from the thin oxide films 16 between the thick field oxide films 5 through the epitaxial layer 3 and the buried layer 2 into the silicon substrate 1. The trench grooves encompasses the bipolar transistor so as to isolate the bipolar transistor from peripheral devices. At the bottom of the trench groove 11, a p$^+$-channel stopper region 4 is formed. A first inter-layer insulator 9 is formed not only on the thin oxide films 16 and the field oxide films 5 but also on both vertical side walls and a bottom wall of each the trench groove 11. Polysilicon films 10a are provided which fill up a lower region of the trench groove 11 covered by the first inter-layer insulator 9. A second inter-layer insulator 12 is provided not only on the first inter-layer insulator 9 and the emitter plug electrode 10 but also on the polysilicon films 10a within the trench grooves 11 so that the second inter-layer insulator 12 fills up the upper region of the trench groove 11. Thus, the trench groove 11 covered by the first inter-layer insulator 9 has the lower region which is filled up with the polysilicon film 10a and the upper region which is filled up the second inter-layer insulator 9. The second inter-layer insulator 12 may be made of a material which shows a low fluidity. A third inter-layer insulator is provided on the second inter-layer insulator 12. The third inter-layer insulator 13 is made of a material which shows a fluidity.

According to the above descriptions, if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the opening of the trench groove 11 is positioned below the top of the first inter-layer insulator 9 over the field oxide film 5. In other words, when the trench groove 11 is formed at the thin oxide film 16, then the level of the opening of the trench groove is lower than when the trench groove 11 were provided at the thick field oxide film 5. On the other hand, when the trench groove 11 is provided at the thin oxide film 16, then the level of the bottom of the trench groove 11 is the same as when the trench groove 11 is provided at the thick field oxide 5. This means that when the trench groove is formed at the thin oxide film 16, the depth of the trench groove 11 is smaller than that when the trench groove 11 is formed at the thick field oxide film 5. This means that the aspect ratio of the trench groove 11 provided at the thin oxide film 16 is smaller than that when the trench groove is provided at the thick field oxide film 5. The small aspect ratio of the trench groove facilitates filling up the trench groove with the inter-layer insulator. When an extremely high density integration is required, a small width of the trench groove is required. This makes the aspect ratio of the trench groove large. It is generally difficult to fill up the trench groove having a large aspect ratio without any cavity. Generally, when the trench groove having the large aspect ratio is filled with the inter-layer insulator made of a material showing a fluidity, then any cavity is likely to be formed as illustrated in FIG. 12. Providing the trench groove at the thin oxide film, however, makes the aspect ratio small thereby resulting in a facilitation of filling up the trench groove with the small width.

Further, the first inter-layer insulator 9 has slopes which are positioned over slopes in boundary areas between the thick field oxide film 5 and the thin oxide film 16. The slopes become down toward the opening of the trench groove 11.

This down slope toward the opening of the trench groove further facilitates filing up the trench groove having a large aspect ratio. In order to facilitate filling up the trench groove, it is preferable that the down slope toward the opening of the trench groove 11 is closed to the opening. In this embodiment, even if the aspect ratio of the trench groove is not less than 3, then it is possible to fill up the trench groove without any cavity. However, a distance between the opening of the trench groove and the down slope is preferably in the range of 1–2 micrometers.

The above bipolar transistor with the improved trench isolations may be fabricated as follows.

With reference to FIG. 15A, a p-type silicon substrate 1 is prepared having a main face and then an n-type impurity is introduced into the silicon substrate 1. An n-type epitaxial layer 3 is grown on the main face of the silicon substrate 1 by an epitaxial growth method. At this time, an n-type buried layer 2 is also formed under the epitaxial layer 3 due to the n-type impurity which has already introduced in the silicon substrate 1. The epitaxial layer 3 has a main face. A thin oxide film 16 is formed on an entire part of the main face of the epitaxial layer 3. The thin oxide film 16 has a thickness in the range of 20–50 nanometers. A silicon nitride film is selectively formed by photo-lithography on the thin oxide film 16 so that the silicon nitride film covers active regions on which base, emitter and collector regions are planed to be formed later. The silicon nitride film has a thickness in the range of 100–200 nanometers.

Field oxide films 5 are selectively formed by a thermal oxidation of silicon using the silicon nitride film as a heat resistive mask so that the field oxide films 5 reside passive regions which are not covered by the silicon nitride films. The silicon nitride films used are then removed. A photo-resist pattern not illustrated is formed by photo-lithography on the field oxide films 5 and the thin oxide film 16. Phosphorus is selectively introduced into a part of the epitaxial layer 3 by an ion-implantation using the photo-resist pattern as a mask. The ion-implantation is carried out under the following conditions. An acceleration energy is 30 KeV. A dose is $5 \times 10^{15}$ cm$^{-2}$. The above photo-resist pattern used is then removed.

Following to the above ion-implantation, the substrate 1 is subjected to an annealing in a nitrogen atmosphere at a temperature of 950° C. for twenty minutes. As a result, an n-type collector diffusion region 6 is formed in the epitaxial layer 3. The bottom of the collector diffusion region 6 is positioned at the same level as an interface between the epitaxial layer 3 and the buried layer 2.

Following to the above annealing process, another photo-resist pattern not illustrated is formed by photo-lithography on the field oxide films 5 and the thin oxide film 16. Boron is selectively introduced into an upper region of the epitaxial layer 3 by an ion-implantation using the photo-resist pattern as a mask. The ion-implantation is carried out under the following conditions. An acceleration energy is set at about 20 KeV so that a p-n junction depth is in the range of 150–200 nanometers. A dose is $5 \times 10^{15}$ cm$^{-2}$. As a result, an intrinsic base region 7 is formed in the upper region of the epitaxial layer 3. The above photo-resist pattern used in then removed.

Subsequently, still another photo-resist pattern not illustrated is formed by photo-lithography on the field oxide films 5 and the thin oxide film 16. $BF_2$ is selectively introduced into a part of the intrinsic base region 7 by an ion-implantation using the photo-resist pattern as a mask. The ion-implantation is carried out under the following conditions. An acceleration energy is 70 KeV. A dose is $5 \times 10^{15}$ cm$^{-2}$. As a result, a p-type base plug region 8 is formed. The above photo-resist pattern used is then removed. Following to the above ion-implantation process, the substrate 1 is subjected to a heat treatment at a temperature of 900° C. for twenty minutes in order to obtain both recovery of damages due to the ion-implantation carried out and activation of the p-type impurity, namely boron.

A photo resist film is formed to cover an entire surface of the substrate 1. Openings are formed in the photo resist film. The openings are positioned over the thin oxide films 16 which encompass the bipolar transistor. The thin oxide films 16 are partially removed by a dry etching process using the photo-resist film with the openings as a mask so that parts of the epitaxial layer 3, which are positioned under the openings, are exposed. The epitaxial layer 3, the buried layer 2 and the silicon substrate 1 are partially etched by the dry etching process using the photo-resist film with the openings as a mask so that trench grooves 11 are formed which extend vertically from the thin oxide films 15 through the epitaxial layer 2 and the buried layer 2 into the silicon substrate 1. Subsequently, boron is implanted using the photo-resist film with the openings as a mask and under the condition of an acceleration energy in the range of 10–30 KeV and a dose in the range of $1 \times 10^{13}$ cm$^{-2}$ to $1 \times 10^{14}$ cm$^{-2}$. As a result, p-type channel stopper regions 4 are formed under the bottoms of the trench grooves 11. The photo-resist film used is then removed. A first inter-layer insulator 9 made of a material showing a less fluidity such as silicon oxide is entirely formed by chemical vapor deposition not only to cover both the thin oxide film 16 and the field oxide film 5 but also to cover both vertical side walls and a bottom wall of each the trench groove 11. The first inter-layer insulator 9 has a thickness in the range of 50–150 nanometers.

With reference to FIG. 15B, an emitter plug contact hole is formed in the first inter-layer insulator 9 and the thin oxide film 15 so that a part of the intrinsic base region 7 is exposed through the emitter plug contact hole. A polysilicon film 10a is entirely deposited by chemical vapor deposition so that the polysilicon film 10a not only extends both on the first inter-layer insulator 9 and within the emitter plug contact hole but also within the trench grooves 11 covered by the first inter-layer insulator 9. As a result, the trench groove is completely filled up with the polysilicon film 10a.

With reference to FIG. 15C, the deposited polysilicon film 10a is then selectively removed by photo-etching so that the polysilicon film 10a remains within and in the vicinity of the emitter plug electrode contact and further remains within the lower region of the trench grooves 11. Subsequently, the remaining part of the polysilicon 10a within and in the vicinity of the emitter plug electrode contact hole is introduced with an impurity so that the remaining part serves as an emitter plug electrode 10. A second inter-layer insulator 12 is entirely deposited on the first inter-layer insulator 9, the emitter plug electrode 10 and the polysilicon film 10a within the trench grooves 11. As a result, the second inter-layer insulator 12 not only resides over the bipolar transistor but also fills up the upper region of the trench groove 11. A third inter-layer insulator 13 made of a material showing a less fluidity such as boron phosphate silicate glass is entirely deposited by chemical vapor deposition on an entire surface of the second inter-layer insulator 12. The substrate is then subjected to a heat treatment in a nitrogen atmosphere at a temperature of 900° C. for twenty minutes in order to cause planarization of the surface of the third inter-layer insulator 13.

Figure 16:
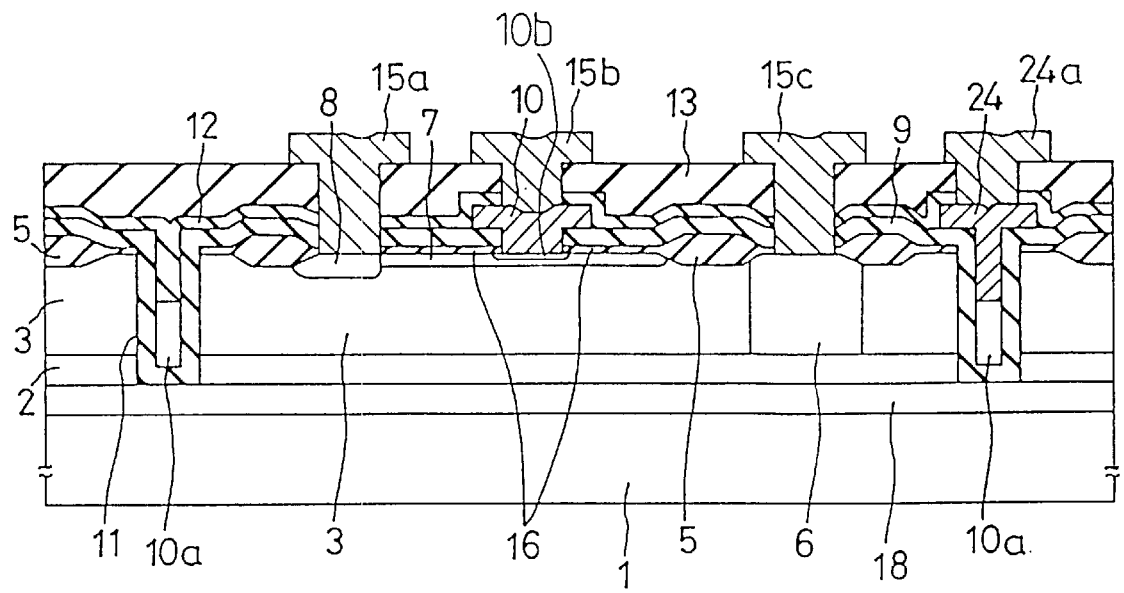
FIG. 16 is a fragmentary cross sectional elevation view illustrative of novel trench isolations which isolate a bipolar transistor in a sixth embodiment according to the present invention.

A sixth embodiment according to the present invention will be described with reference to FIG. 16 which illustrates the novel trench isolations isolating the bipolar transistor. The trench isolation structure of this embodiment differs from that of the fifth embodiment in the followings. A silicon oxide film 18 is provided between a buried layer 18 and a silicon substrate 1. Trench grooves 11 are extend vertically from thin oxide films 16 through an epitaxial layer 3 and the buried layer 2 and the bottom of each the trench groove 11 reaches an interface between the silicon oxide layer 18 and the buried layer 2 so that the epitaxial layer 3 acting as a collector region and a collector diffusion region 6 are completely isolated by the trench isolations and the silicon oxide layer 18. A part of the trench isolations is provided at its top portion with a plug electrode 24 and with a plug interconnection layer 24a on the plug electrode 24. The plug electrode 24 is applied with the minimum voltage in an available voltage range in order to obtain an absorption of noises.

The structure of the bipolar transistor with the trench isolations will be described in detail. A silicon oxide layer 18 is formed on a silicon substrate 1. An n-type buried layer 2 is formed on the silicon oxide layer 18. An n-type epitaxial layer 3 is formed on a top surface of the n-type buried layer 2. A thin oxide film 16 is selectively provided in an active region and on a top surface of the n-type epitaxial layer 3. Thick field oxide films 5 are selectively provided in passive regions and on the top surface of the n-type epitaxial layer 3. A p-type base region 7 is selectively formed under the thin oxide film 16 and in an upper region of the n-type epitaxial layer 3. A p-type base plug region 8 is selectively provided under the thin oxide film 16 and in an upper region of the n-type epitaxial layer 3 so that p-type base plug region 8 is adjacent to the p-type base region 7. An n-type emitter region 10b is selectively provided in an upper region of the p-type base region 7. The n-type emitter region 10b is separated by the p-type base region 7 from both the p-type base plug region 8 and the n-type epitaxial layer 3. The thin oxide film 16 has an opening which is positioned over the emitter region 10b so that the emitter region 10b is not covered by the thin oxide film 16, whilst the base region 7 is covered by the thin oxide film 16. The tin oxide film 16 has another opening positioned over the p-type base plug region 8 so that the base plug region 8 is not covered by the thin oxide film 16. An n-type collector diffusion region 6 is selectively formed in the n-type epitaxial layer 3, wherein the collector diffusion region 6 is separated by the n-type epitaxial layer 3 and by the field oxide film 5 from the p-type base region 7. The field oxide film 5 has an opening which is positioned over the collector diffusion region 6 so that the collector diffusion region 6 is not covered by the field oxide film 5. The collector diffusion region 6 and the base plug region 8 are positioned at opposite sides to each other of the base region 7.

Trench grooves 11 are selectively provided which extend vertically from the thin oxide films 16 through the epitaxial layer 3 and the buried layer 2 to an interface between the buried layer 2 and the silicon oxide layer 18. The trench grooves 10a encompasses the bipolar transistor so as to isolate the bipolar transistor from peripheral devices. The bottom of the trench groove 11 reaches the interface between the buried layer 2 and the silicon oxide layer 18. A first inter-layer insulator 9 is formed not only on the thin oxide films 16 and the field oxide films 5 but also on both vertical side walls and a bottom wall of each the trench groove 11. Polysilicon films 10a are provided which fill up lower regions of the trench grooves 11 covered by the first inter-layer insulator 9. A second inter-layer insulator 12 is provided not only on the first inter-layer insulator 9 and the emitter plug electrode 10 but also on the polysilicon films 10a within the trench grooves 11 so that the second inter-layer insulator 12 fills up the upper region of the trench groove 11. Thus, the trench groove 11 covered by the first inter-layer insulator 9 has the lower region which is filled up with the polysilicon film 10a and the upper region which is filled up with the second inter-layer insulator 9. The second inter-layer insulator 12 may be made of a material which shows a low fluidity. A third inter-layer insulator 13 is provided on the second inter-layer insulator 12. The third inter-layer insulator 13 is made of a material which shows a fluidity. A base interconnection layer 15a is provided on the base plug region 8. An emitter interconnection layer 15b is provided on the emitter plug electrode 10. A collector interconnection layer 15c is provided on the collector diffusion region 6. A part of the trench grooves 11 is provided at its top portion with a plug electrode 24 in place of the second inter-layer insulator 12. A plug interconnection layer 24a is provided on the plug electrode 24.

According to the above descriptions, if the trench isolation filled with the inter-layer insulator were subjected to any heat treatment, the thermal stress is uniformly applied to the upper part of the trench isolation for the following reasons. As described above, the upper part of the trench groove is filled with the inter-layer insulator. This causes substantially no difference in thermal expansion at any positions around the upper part of the trench isolation. No difference in thermal expansion at any positions around the upper part of the trench isolation results in that the entire part of the trench isolation is applied with a relatively uniform thermal stress. Therefore, almost no stress concentration is caused at any positions around the trench isolation. Almost no stress concentration can prevent formation of crystal defects at any positions around the trench isolation. No crystal defect causes no crystal dislocation which extends along an interface between the silicon layer and reaches an active region. No crystal dislocation causes no current leakage nor other deterioration of the device performance.

As described above, the opening of the trench groove 11 is positioned below the top of the first inter-layer insulator 9 over the field oxide film 5. In other words, when the trench groove 11 is formed at the thin oxide film 16, then the level of the opening of the trench groove is lower than when the trench groove 11 were provided at the thick field oxide film 5. On the other hand, when the trench groove 11 is provided at the thin oxide film 16, then the level of the bottom of the trench groove 11 is the same as when the trench groove 11 is provided at the thick field oxide film 5. This means that when the trench groove is formed at the thin oxide film 16, the depth of the trench groove 11 is smaller than that when the trench groove 11 is formed at the thick field oxide film 5. This means that the aspect ratio of the trench groove 11 provided at the thin oxide film 16 is smaller than that when the trench groove is provided at the thick field oxide film 5. The small aspect ratio of the trench groove facilitates filling up the trench groove with the inter-layer insulator. When an extremely high density integration is required, a small width of the trench groove is required. This makes the aspect ratio of the trench groove large. It is generally difficult to fill up the trench groove having a large aspect ratio without any cavity. Generally, when the trench groove having the large aspect ratio is filled with the inter-layer insulator made of a material showing a fluidity, then any cavity is likely to be formed as illustrated in FIG. 12. Providing the trench groove at the thin oxide film, however, makes the aspect ratio small thereby resulting in a facilitation of filling up the trench groove with the small width.

Further, the first inter-layer insulator 9 has slopes which are positioned over slopes in boundary areas between the thick field oxide film 5 and the thin oxide film 16. The slopes become down toward the opening of the trench groove 11. This down slope toward the opening of the trench groove further facilitates filling up the trench groove having a large aspect ratio. In order to facilitate filling up the trench groove, it is preferable that the down slope toward the opening of the trench groove 11 is closed to the opening. In this embodiment, even if the aspect ratio of the trench groove is not less than 3, then it is possible to fill up the trench groove without any cavity. However, a distance between the opening of the trench groove and the down slope is preferably in the range of 1–2 micrometers.

Whereas modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims all modifications which fall within the spirit and scope of the invention.

What is claimed is:

1. A method for forming a trench isolation in a semiconductor region, said method comprising the steps of:

forming a first insulation film on a top surface of a semiconductor region;

selectively forming a trench groove extending vertically from said first insulation film into said semiconductor region so that a bottom of said trench groove lies below an interface between said first insulation film and said semiconductor region; and forming an inter-layer insulator which resides not only on said first insulation film but also within said trench groove so that said inter-layer insulator fills up said trench groove.

2. The method as claimed in claim 1, further comprising the step of forming, after said third step, a second insulation film which extends both on said first insulation film and on vertical side walls and a bottom wall of said trench groove.

3. The method as claimed in claim 1, wherein said first oxide film is formed by the steps of:

forming a thin oxide film on an entire surface of said semiconductor region; and selectively forming thick field oxide films so that said first insulation film comprises a thin silicon oxide film portion and thick field oxide film portions sandwiching said thin silicon oxide film portion; and wherein said trench groove is formed which extends vertically from said thin silicon oxide film portion into said semiconductor region so that an opening portion of said trench groove is positioned below top portions of said field oxide film portions, and an interface between said inter-layer insulator and said first insulation film is sloped down toward said opening portion.

4. The method as claimed in claim 1, wherein said first oxide film is formed by the steps of:

forming a thin oxide film on an entire surface of said semiconductor region; and selectively forming thick field oxide films so that said first insulation film comprises a thick field oxide film portion and thin silicon oxide film portions sandwiching said thick field oxide film portion; and wherein said trench groove is formed which extends vertically from said thick field oxide film portion into said semiconductor region.

5. The method as claimed in claim 4, further comprising the step of forming spacer layers which extend both on said thin silicon oxide film portions and on a part of said thick field oxide film portion so that said inter-layer insulator is formed which extends both on said spacer layers and on the remaining part, which is not covered by said spacer layers, of said field oxide film portion and interfaces of said inter-layer insulator with said spacer layer and with said thick field oxide film portion have steps which are down toward an opening of said trench groove.

6. The method as claimed in claim 1, wherein said second isolation film is formed by the step of forming a silicon oxide film both on said first insulation film and on said vertical side walls and said bottom wall of said trench groove.

7. The method as claimed in claim 1, wherein said second isolation film is formed by the steps of:

forming a silicon oxide film both on said first insulation film and on said vertical side walls and said bottom wall of said trench groove; and forming a silicon nitride film on said silicon oxide film.

8. The method as claimed in claim 1, wherein said inter-layer insulator is formed by chemical vapor deposition of an insulation material which shows a fluidity at a high temperature.

9. The method as claimed in claim 7, wherein said inter-layer insulator is formed by chemical vapor deposition of boron phosphate silicate glass and subsequent heat treatment at a temperature of approximately 900° C. for about twenty minutes.

10. The method as claimed in claim 1, wherein said trench groove is formed after at least one device is formed in said semiconductor region.

11. A method for forming a trench isolation structure in a silicon region, said method comprising the steps of:

forming a first insulation film on a top surface of a silicon region;

selectively forming a trench groove extending vertically from said first insulation film to said silicon region so that a bottom of said trench groove lies below an interface between said first insulation film and said silicon region;

forming a second insulation film which extends at least on vertical side walls and a bottom wall of said trench groove;

selectively forming a polysilicon film on said second insulation film except on its upper portion so that said polysilicon film fills with said trench groove expect for its upper region; and forming an inter-layer insulator which resides not only on said first insulation film but also on said polysilicon film so that said inter-layer insulator fills up said upper region of said trench groove.

12. The method as claimed in claim 11, wherein said first oxide film is formed by the steps of:

forming a thin oxide film on an entire surface of said semiconductor region; and selectively forming thick field oxide films so that said first insulation film comprises a thin silicon oxide film portion and thick field oxide film portions sandwiching said thin silicon oxide film portion; and wherein said trench groove is formed which extends vertically from said thin silicon oxide film portion into said semiconductor region so that an opening portion of said trench groove is positioned below top portions of said field oxide film portions, and an interface between said inter-layer insulator and said first insulation film is sloped down toward said opening portion.

13. The method as claimed in claim 11, wherein said first oxide film is formed by the steps of:

forming a thin oxide film on an entire surface of said semiconductor region; and selectively forming thick field oxide films so that said first insulation film comprises a thick field oxide film portion and thin silicon oxide film portions sandwiching said thick field oxide film portion; and wherein said trench groove is formed which extends vertically from said thick field oxide film portion into said semiconductor region.

14. The method as claimed in claim 13, further comprising the step of forming spacer layers which extend both on said thin silicon oxide film portions and on a part of said thick field oxide film portion so that said inter-layer insulator is formed which extends both on said spacer layers and on the remaining part, which is not covered by said spacer layers, of said field oxide film portion and interfaces of said inter-layer insulator with said spacer layer and with said thick field oxide film portion have steps which are down toward an opening of said trench groove.

15. The method as claimed in claim 11, wherein said second isolation film is formed by the steps of:

forming a silicon oxide film both on said first insulation film and on said vertical side walls and said bottom wall of said trench groove; and forming a silicon nitride film on said silicon oxide film.

16. The method as claimed in claim 11, wherein said polysilicon film is formed by chemical vapor deposition of polysilicon and subsequent selective etching said deposited polysilicon.

17. The method as claimed in claim 11, wherein said inter-layer insulator is formed by chemical vapor deposition of an insulation material which shows a fluidity at a high temperature.

18. The method as claimed in claim 17, wherein said inter-layer insulator is formed by chemical vapor deposition of boron phosphate silicate glass and subsequent heat treatment at a temperature of approximately 900° C. for about twenty minutes.

19. The method as claimed in claim 11, wherein said trench groove is formed after at least one device is formed in said semiconductor region.

20. A method for forming a bipolar transistor with trench isolations comprising the steps of:

forming a buried layer on a silicon substrate;

forming an epitaxial layer on said buried layer;

forming a first insulation film on a top surface of said epitaxial layer, said first insulation film comprising at least one thin film portion and at least two thick field oxide film portions sandwiching said at least one thin oxide film portion;

selectively forming a base region in an upper region of said epitaxial layer and under said thin oxide film portion;

selectively forming an emitter region in an upper region of said base region and an emitter plug electrode on said emitter region;

selectively forming at least one trench groove extending vertically from said first insulation film through said epitaxial layer and said buried layer into said silicon substrate; and forming an inter-layer insulator both over said first insulation film and above said emitter plug electrode and within said trench groove so that said inter-layer insulator fills up said trench groove.

21. The method as claimed in claim 21, further comprising the step of forming, after said seventh step, a second insulation film which extends both on said first insulation film and on vertical side walls and a bottom wall of said trench groove.

22. The method as claimed in claim 21, wherein said first oxide film is formed by the steps of:

forming a thin oxide film on an entire surface of said epitaxial layer; and selectively forming thick field oxide films so that said first insulation film comprises a thin silicon oxide film portion and thick field oxide film portions sandwiching said thin silicon oxide film portion; and wherein said trench groove is formed which extends vertically from said thin silicon oxide film portion into said silicon substrate so that an opening portion of said trench groove is positioned below top portions of said field oxide film portions, and an interface between said inter-layer insulator and said first insulation film is sloped down toward said opening portion.

23. The method as claimed in claim 21, wherein said first oxide film is formed by the steps of:

forming a thin oxide film on an entire surface of said epitaxial layer; and selectively forming thick field oxide films so that said first insulation film comprises a thick field oxide film portion and thin silicon oxide film portions sandwiching said thick field oxide film portion; and wherein said trench groove is formed which extends vertically from said thick field oxide film portion into said silicon substrate.

24. The method as claimed in claim 23, further comprising the step of forming spacer layers which extend both on said thin silicon oxide film portions and on a part of said thick field oxide film portion so that said inter-layer insulator is formed which extends both on said spacer layers and on the remaining part, which is not covered by said spacer layers, of said field oxide film portion and interfaces of said inter-layer insulator with said spacer layer and with said thick field oxide film portion have steps which are down toward an opening of said trench groove.

25. The method as claimed in claim 21, wherein said second isolation film is formed by the step of forming a silicon oxide film both on said first insulation film and on said vertical side walls and said bottom wall of said trench groove.

26. The method as claimed in claim 21, wherein said second isolation film is formed by the steps of:

forming a silicon oxide film both on said first insulation film and on said vertical side walls and said bottom wall of said trench groove; and forming a silicon nitride film on said silicon oxide film.

27. The method as claimed in claim 21, wherein said inter-layer insulator is formed by chemical vapor deposition of an insulation material which shows a fluidity at a high temperature.

28. The method as claimed in claim 27, wherein said inter-layer insulator is formed by chemical vapor deposition of boron phosphate silicate glass and subsequent heat treatment at a temperature of approximately 900° C. for about twenty minutes.

29. A method for forming a bipolar transistor with trench isolations comprising:

forming a buried layer on a silicon substrate;

forming an epitaxial layer on said buried layer;

forming a first insulation film on a top surface of said epitaxial layer, said first insulation film comprising at least one thin oxide film portion and at least two thick field oxide film portions sandwiching said at least one thin oxide film;

selectively forming a base region in an upper region of said epitaxial layer and under said at least one thin oxide film;

selectively forming an emitter region in an upper region of said base region and an emitter plug electrode on said emitter region;

selectively forming at least one trench groove extending vertically from said first insulation film through said epitaxial layer and said buried layer into said silicon substrate;

forming a second insulation film which extend at least on vertical said walls and a bottom wall of said trench groove;

selectively forming a polysilicon film on said second insulation film except on its upper portion so that said polysilicon film fills with said trench groove except for its upper region; and forming an inter-layer insulator which resides not only on said first insulation film but also on said polysilicon film so that said inter-layer insulator fills up said upper region of said trench groove.

30. The method as claimed in claim 29, wherein said first oxide film is formed by the steps of:

forming a thin oxide film on an entire surface of said epitaxial layer; and selectively forming thick field oxide films so that said first insulation film comprises a thin silicon oxide film portion and thick field oxide film portions sandwiching said thin silicon oxide film portion; and wherein said trench groove is formed which extends vertically from said thin silicon oxide film portion into said silicon substrate so that an opening portion of said trench groove is positioned below top portions of said field oxide film portions, and an interface between said inter-layer insulator and said first insulation film is sloped down toward said opening portion.

31. The method as claimed in claim 29, wherein said first oxide film is formed by the steps of:

forming a thin oxide film on an entire surface of said epitaxial layer; and selectively forming thick field oxide films so that said first insulation film comprises a thick field oxide film portion and thin silicon oxide film portions sandwiching said thick field oxide film portion; and wherein said trench groove is formed which extends vertically from said thick field oxide film portion into said silicon substrate.

32. The method as claimed in claim 31, further comprising the step of forming spacer layers which extend both on said thin silicon oxide film portions and on a part of said thick field oxide film portion so that said inter-layer insulator is formed which extends both on said spacer layers and on the remaining part, which is not covered by said spacer layers, of said field oxide film portion and interfaces of said inter-layer insulator with said spacer layer and with said thick field oxide film portion have steps which are down toward an opening of said trench groove.

33. The method as claimed in claim 30, wherein said second isolation film is formed by the step of forming a silicon oxide film both on said first insulation film and on said vertical side walls and said bottom wall of said trench groove.

34. The method as claimed in claim 30, wherein said second isolation film is formed by the steps of:

forming a silicon oxide film both on said first insulation film and on said vertical side walls and said bottom wall of said trench groove; and forming a silicon nitride film on said silicon oxide film.

35. The method as claimed in claim 30, wherein said polysilicon film is formed by chemical vapor deposition of polysilicon and subsequent selective etching said deposited polysilicon.

36. The method as claimed in claim 30, wherein said inter-layer insulator is formed by chemical vapor deposition of an insulation material which shows a fluidity at a high temperature.

37. The method as claimed in claim 36, wherein said inter-layer insulator is formed by chemical vapor deposition of boron phosphate silicate glass and subsequent heat treatment at a temperature of approximately 900° C. for about twenty minutes.

38. A method for forming a MOS field effect transistor with a trench isolation comprising the steps of:

forming an impurity doped well region on a silicon substrate;

forming a first insulation film on a top surface of said impurity doped well region, said first insulation film comprising at least one thick field oxide film portion and at least two thin oxide film portions sandwiching said at least one thick field oxide film portion;

selectively forming at least two gate electrodes on said at least two thin film portions;

selectively forming source/drain diffusion regions in an upper region of said impurity doped well region and under each of said thin oxide film portions, said source/drain diffusion regions sandwiching each of at least two channel regions under said at least two gate electrodes;

selectively forming a trench groove extending vertically from said thick field oxide film portion through said impurity doped well region into said silicon substrate; and forming an inter-layer insulator not only over said first insulation film and above said gate electrode but also within said trench groove so that said inter-layer insulator fills up said trench groove.

39. The method as claimed in claim 38, further comprising the step of forming, after said fifth step, a second insulation film both on said first insulation film and on vertical side walls and a bottom wall of said trench groove.

40. The method as claimed in claim 38, wherein said at least two gate electrodes are formed respectively which extend both on said thin silicon oxide film portions and on parts of said thick field oxide film portions so that said inter-layer insulator extends both on said gate electrodes and on the remaining part, which is not covered by said gate electrodes, of said field oxide film portion and a bottom face of said inter-layer insulator positioned above said trench groove has steps which are down toward an opening of said trench groove.

41. The method as claimed in claim 38, wherein said inter-layer insulator is formed by chemical vapor deposition of an insulation material which shows a fluidity at a high temperature.

42. The method as claimed in claim 41, wherein said inter-layer insulator is formed by chemical vapor deposition of boron phosphate silicate glass and subsequent heat treatment at a temperature of approximately 900° C. for about twenty minutes.

43. A method for forming a MOS field effect transistor with a trench isolation comprising the steps of:

forming an impurity doped well region on a silicon substrate;

forming a first insulation film on a top surface of said impurity doped well region, said first insulation film comprising at least one thick field oxide film portion and at least two thin oxide film portions sandwiching said at least one thick field oxide film portion;

selectively forming at least two gate electrodes on said at least two thin film portions respectively;

selectively forming source/drain diffusion regions in an upper region of said impurity doped well region and under each of said thin oxide film portions, said source/drain diffusion regions defining each of at least two channel regions under each of said at least two gate electrodes;

selectively forming a trench groove extending vertically from said thick field oxide film portion through said impurity doped well region into said silicon substrate;

selectively forming a second insulation film which extends at least on vertical side walls and a bottom wall of said trench groove;

selectively forming a polysilicon film on said second insulation film except on its upper portion so that said polysilicon film fills with said trench groove except for its upper region; and forming an inter-layer insulator which resides not only on said first insulation film but also on said polysilicon film so that said inter-layer insulator fills up said upper region of said trench groove.

44. The method as claimed in claim 43, wherein said at least two gate electrodes are formed respectively which extend both on said thin silicon oxide film portions and on parts of said thick field oxide film portions so that said inter-layer insulator extends both on said gate electrodes and on the remaining part, which is not covered by said gate electrodes, of said field oxide film portion and a bottom face of said inter-layer insulator positioned above said trench groove has steps which are down toward an opening of said trench grooves.

45. The method as claimed in claim 43, wherein said polysilicon film is formed by chemical vapor deposition of polysilicon and subsequent selective etching said deposited polysilicon.

46. The method as claimed in claim 43, wherein said inter-layer insulator is formed by chemical vapor deposition of an insulation material which shows a fluidity at a high temperature.

47. The method as claimed in claim 46, wherein said inter-layer insulator is formed by chemical vapor deposition of boron phosphate silicate glass and subsequent heat treatment at a temperature of approximately 900° C. for about twenty minutes.

* * * * *